US011456392B2

(12) United States Patent
Jarrahi et al.

(10) Patent No.: US 11,456,392 B2
(45) Date of Patent: Sep. 27, 2022

(54) METALLO-GRAPHENE NANOCOMPOSITES AND METHODS FOR USING METALLO-GRAPHENE NANOCOMPOSITES FOR ELECTROMAGNETIC ENERGY CONVERSION

(71) Applicant: The Regents of the University of California, Oakland, CA (US)

(72) Inventors: Mona Jarrahi, Los Angeles, CA (US); Semih Cakmakyapan, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 1 day.

(21) Appl. No.: 16/617,473

(22) PCT Filed: Jun. 1, 2018

(86) PCT No.: PCT/US2018/035707
§ 371 (c)(1),
(2) Date: Nov. 26, 2019

(87) PCT Pub. No.: WO2018/223068
PCT Pub. Date: Dec. 6, 2018

(65) Prior Publication Data
US 2020/0111925 A1    Apr. 9, 2020

Related U.S. Application Data

(60) Provisional application No. 62/514,668, filed on Jun. 2, 2017, provisional application No. 62/513,951, filed on Jun. 1, 2017.

(51) Int. Cl.
*H01L 31/0224* (2006.01)
*H01L 31/028* (2006.01)
(Continued)

(52) U.S. Cl.
CPC .... *H01L 31/022408* (2013.01); *H01L 31/028* (2013.01); *H01L 31/022441* (2013.01);
(Continued)

(58) Field of Classification Search
CPC ............... H01L 31/022408; H01L 31/028
See application file for complete search history.

(56) References Cited

U.S. PATENT DOCUMENTS 6,529,093 B2   3/2003  Ma
7,321,275 B2   1/2008  Chou et al.
(Continued)

FOREIGN PATENT DOCUMENTS

EP    3635752 A1    4/2020
KR    20080004467 A   1/2008
(Continued)

OTHER PUBLICATIONS

Extended European Search Report for European Application No. 18810176.0, Search completed Dec. 14, 2020, dated Mar. 22, 2021, 14 Pgs.
(Continued)

*Primary Examiner* — Aaron J Gray
(74) *Attorney, Agent, or Firm* — KPPB LLP

(57) ABSTRACT

Nanocomposites in accordance with many embodiments of the invention can be capable of converting electromagnetic radiation to an electric signal, such as signals in the form of current or voltage. In some embodiments, metallic nanostructures are integrated with graphene material to form a metallo-graphene nanocomposite. Graphene is a material that has been explored for broadband and ultrafast photodetection applications because of its distinct optical and electronic characteristics. However, the low optical absorption and the short carrier lifetime of graphene can limit its use in many applications. Nanocomposites in accordance
(Continued)

with various embodiments of the invention integrates metallic nanostructures, such as (but not limited to) plasmonic nanoantennas and metallic nanoparticles, with a graphene-based material to form metallo-graphene nanostructures that can offer high responsivity, ultrafast temporal responses, and broadband operation in a variety of optoelectronic applications.

20 Claims, 22 Drawing Sheets

(51) Int. Cl.
| | |
|---|---|
| H01L 31/032 | (2006.01) |
| H01L 31/0384 | (2006.01) |
| H01L 31/113 | (2006.01) |
| H01L 31/0352 | (2006.01) |
| H02S 10/30 | (2014.01) |

(52) U.S. Cl.
CPC ...... *H01L 31/032* (2013.01); *H01L 31/03529* (2013.01); *H01L 31/03845* (2013.01); *H01L 31/035281* (2013.01); *H01L 31/1136* (2013.01); *H02S 10/30* (2014.12)

(56) References Cited

U.S. PATENT DOCUMENTS

| | | | |
|---|---|---|---|
| 7,834,722 | B2 | 11/2010 | Millet |
| 9,196,766 | B1 | 11/2015 | Egerton et al. |
| 9,293,627 | B1 | 3/2016 | Beechem, III et al. |
| 9,859,079 | B2 | 1/2018 | Jarrahi et al. |
| 2005/0236260 | A1 | 10/2005 | Pasch et al. |
| 2007/0278075 | A1 | 12/2007 | Terano et al. |
| 2008/0001691 | A1 | 1/2008 | Hong et al. |
| 2008/0277672 | A1 | 11/2008 | Hovey et al. |
| 2011/0042650 | A1* | 2/2011 | Avouris ........... H01L 31/035209 977/734 |
| 2012/0122259 | A1 | 5/2012 | Tung et al. |
| 2013/0001514 | A1 | 1/2013 | Colli |
| 2013/0193404 | A1* | 8/2013 | Koppens ............. H01L 31/0475 977/734 |
| 2014/0332757 | A1 | 11/2014 | Avouris et al. |
| 2015/0053980 | A1 | 2/2015 | Lee et al. |
| 2015/0357504 | A1 | 12/2015 | Chen et al. |
| 2016/0005894 | A1* | 1/2016 | Zhang ................... H01L 31/028 257/29 |
| 2016/0164451 | A1 | 6/2016 | Lenert et al. |
| 2016/0196943 | A1 | 7/2016 | Jarrahi et al. |
| 2017/0301819 | A1* | 10/2017 | Yao ....................... H01L 31/028 |

FOREIGN PATENT DOCUMENTS

| | | |
|---|---|---|
| WO | 2015021100 A1 | 2/2015 |
| WO | 2018223068 A1 | 12/2018 |

OTHER PUBLICATIONS

Cakmakyapan et al., "Plasmonic Nanoantenna Based Ultrafast and Broadband Graphene Photodetectors", 2017 Conference on Lasers and Electro-Optics (CLEO), The Optical society, 2017, pp. 1-2. XP033237858.
International Preliminary Report on Patentability for International Application PCT/US2018/035707, Report dated Dec. 3, 2019, dated Dec. 12, 2019, 10 Pgs.
International Preliminary Report on Patentability for International Application PCT/US2014/049866, Report dated Feb. 9, 2016, dated Feb. 18, 2016, 7 Pgs.
International Search Report and Written Opinion for International Application No. PCT/US2014/049866, Search completed Nov. 19, 2014, dated Nov. 20, 2014, 9 Pgs.
International Search Report and Written Opinion for International Application No. PCT/US2018/035707, Search completed Aug. 6, 2018, dated Aug. 29, 2018, 18 Pgs.
An et al., "Tunable graphene-silicon heterojunctions for ultrasensitive photodetection", Nano letters, vol. 13, No. 3, Jan. 25, 2013, pp. 909-916.
Bae et al., "Roll-to-roll production of 30-inch graphene films for transparent electrodes", Nature Nanotechnology, published online Jun. 20, 2010, vol. 5, pp. 574-578.
Banszerus et al., "Ultrahigh-mobility graphene devices from chemical vapor deposition on reusable copper", Science Advances, vol. 1, No. 6, Jul. 31, 2015, pp. 1-6.
Bolotina et al., "Ultrahigh electron mobility in suspended graphene", Solid State Communications, vol. 146, Issues 9-10, Jun. 2008, pp. 351-355.
Bonaccorso et al., "Graphene photonics and optoelectronics", Nature Photonics, vol. 4, Sep. 2010, pp. 611-622.
Brenneis et al., "THz-circuits driven by photo-thermoelectric, gate-tunable graphene-junctions", Scientific Reports, vol. 6, Article 35654, Oct. 20, 2016 (Oct. 20, 2016), pp. 1-9.
Brida et al., "Ultrafast collinear scattering and carrier multiplication in graphene", Nature Communications, vol. 4, No. 1987, Jun. 17, 2013, pp. 1-9.
Cakmakyapan et al., "Gold-Patched Graphene Nanoribbons for High-Responsivity and Ultrafast Photodetection from Visible to Infrared Regimes", arXiv, article No. 1710.00053, Sep. 28, 2017 (Sep. 28, 2017), pp. 1-33.
Chakraborty et al., "Optical antenna enhanced graphene photodetector", Applied Physics Letters, vol. 105, No. 24, Article 241114, Dec. 15, 2014, pp. 241114-1-241114-4.
Chitara et al., "Infrared photodetectors based on reduced graphene oxide and graphene nanoribbons", Advanced Materials, vol. 23, No. 45, Dec. 1, 2011, pp. 5419-5424.
Echtermeyer et al., "Strong plasmonic enhancement of photovoltage in graphene", Nature Communications, vol. 2, No. 458, Aug. 30, 2011, pp. 1-5.
Echtermeyer et al., "Surface plasmon polariton graphene photodetectors", Nano Letters, vol. 16, No. 1, Dec. 14, 2015, pp. 8-20.
Engel et al., "Light-matter interaction in a microcavity-controlled graphene transistor", Nature Communications, vol. 3, No. 906, Jun. 19, 2012, pp. 1-6.
Fang et al., "Graphene-antenna sandwich photodetector", Nano Letters, vol. 12, No. 7, Jun. 15, 2012, pp. 3808-3813.
Freitag et al., "Photoconductivity of biased graphene", Nature Photonics, 2013, vol. 7, pp. 53-59, https://doi.org/10.1038/nphoton.2012.314.
Freitag et al., "Photocurrent in graphene harnessed by tunable intrinsic plasmons", Nature Communications, vol. 4, No. 1951, Jun. 3, 2013, pp. 1-8.
Furchi et al., "Microcavity-integrated graphene photodetector", Nano Letters, vol. 12, No. 6, May 7, 2012, pp. 2773-2777.
Gan et al., "Chip-integrated ultrafast graphene photodetector with high responsivity", Nature Photonics, vol. 7, Nov. 2013, pp. 883-887.
Gan et al., "Strong enhancement of light-matter interaction in graphene coupled to a photonic crystal nanocavity", Nano Letters, vol. 12, No. 11, Oct. 8, 2012, pp. 5626-5631.
Geim et al., "The rise of graphene", Nature Materials, Mar. 2007, vol. 6, pp. 183-191.
Grigorenko et al., "Graphene plasmonics", Nature Photonics, vol. 6, Nov. 5, 2012, pp. 749-758.
Guo et al., "Black Phosphorus Mid-Infrared Photodetectors with High Gain", arXiv, article No. 1603.07346, Mar. 23, 2016 (Mar. 23, 2016), pp. 1-15.
Guo et al., "Oxygen-assisted charge transfer between ZnO quantum dots and graphene", Small, vol. 9, No. 18, Mar. 21, 2013, pp. 3031-3036.
Hirai et al., "Electron mobility calculation for graphene on substrates", Journal of Applied Physics, vol. 116, No. 083703, 2014, 7 pgs.
Kang et al., "Intrinsic photocurrent characteristics of graphene photodetectors passivated with Al2O3", Optics Express, vol. 21, No. 20, Oct. 7, 2013, pp. 23391-23400.

(56) References Cited

OTHER PUBLICATIONS

Kim et al., "Graphene based fiber optic surface plasmon resonance for bio-chemical sensor applications", Sensors and Actuators B: Chemical, Oct. 2013, vol. 187, pp. 426-433, https://doi.org/10.1016/j.snb.2013.01.040.

Konstantatos et al., "Hybrid graphene-quantum dot phototransistors with ultrahigh gain", Nature Nanotechnology, vol. 7, Jun. 2012, pp. 363-368.

Koppens et al., "Photodetectors based on graphene, other two-dimensional materials and hybrid systems", Nature Nanotechnology, vol. 9, No. 10, Oct. 2014, pp. 780-793.

Liu et al., "Graphene photodetectors with ultra-broadband and high responsivity at room temperature", Nature Nanotechnology, vol. 9, Mar. 16, 2014, pp. 273-278.

Liu et al., "Plasmon resonance enhanced multicolour photodetection by graphene", Nature Communications, vol. 2, No. 579, Dec. 6, 2011, pp. 1-7.

Mak et al., "Optical spectroscopy of graphene: From the far infrared to the ultraviolet", Solid State Communications, vol. 152, Issue 15, Aug. 2012, pp. 1341-1349.

Mueller et al., "Graphene photodetectors for high-speed optical communications", Nature Photonics, vol. 4, No. 5, Mar. 28, 2010, pp. 297-301.

Mueller et al., "The role of contacts in graphene transistors: A scanning photocurrent study", Physical Review B, vol. 79, Issue 24, Article 245430, Jun. 25, 2009, 22 pages.

Nikitskiy et al., "Integrating an electrically active colloidal quantum dot photodiode with a graphene phototransistor", Nature Communications, vol. 7, No. 11954, Jun. 17, 2016, pp. 1-8.

Plotzing et al., "Experimental verification of carrier multiplication in graphene", Nano letters, vol. 14, No. 9, Aug. 21, 2014, pp. 5371-5375.

Pop, "Energy Dissipation and Transport in Nanoscale Devices", Nano Research, 2010, vol. 3, pp. 147-169,https://doi.org/10.1007/s12274-010-1019-z.

Pospischil et al., "CMOS-compatible graphene photodetector covering all optical communication bands", Nature Photonics, vol. 7, Nov. 2013, pp. 892-896.

Schall et al., "50 GBit/s photodetectors based on wafer-scale graphene for integrated silicon photonic communication systems", ACS Photonics, vol. 1, No. 9, Aug. 14, 2014, pp. 781-784.

Shiue et al., "Enhanced photodetection in graphene-integrated photonic crystal cavity", Applied Physics Letters, vol. 103, Issue 34, Article 241109, 2013, pp. 241109-1-241109-4.

Son et al., "Sub-10 nm Graphene Nanoribbon Array Field-Effect Transistors Fabricated by Block Copolymer Lithography", Advanced Materials, vol. 25, No. 34, Jun. 25, 2013, pp. 4723-4728.

Sun et al., "Graphene Mode-Locked Ultrafast Laser", ACS Nano, Jan. 25, 2010, vol. 4, No. 2, pp. 803-810, https://doi.org/10.1021/nn901703e.

Sun et al., "Infrared photodetectors based on CVD-grown graphene and PbS quantum dots with ultrahigh responsivity", Advanced Materials, vol. 24, Aug. 31, 2012, pp. 5878-5883.

Tielrooij et al., "Photoexcitation cascade and multiple hot-carrier generation in graphene", Nature Physics, vol. 9, Apr. 2013, pp. 248-252.

Wang et al., "High-responsivity graphene/silicon-heterostructure waveguide photodetectors", Nature Photonics, vol. 7, Sep. 15, 2013, pp. 888-891.

Wei et al., "Controllable unzipping for intramolecular junctions of graphene nanoribbons and single-walled carbon nanotubes", Nature Communications, vol. 4, No. 1374, Jan. 22, 2013, pp. 1-9.

Xia et al., "Photocurrent Imaging and Efficient Photon Detection in a Graphene Transistor", Nano Letters, vol. 9, No. 3, Feb. 9, 2009, pp. 1039-1044.

Xia et al., "Ultrafast graphene photodetector", Nature Nanotechnology, vol. 4, Oct. 11, 2009 (Oct. 11, 2009), pp. 839-843.

Yan et al., "Infrared Spectroscopy of Wafer-Scale Graphene", arXiv, article No. 1111.3714, Nov. 16, 2011 (Nov. 16, 2011), pp. 1-20.

Yao et al., "Broad Electrical Tuning of Graphene-Loaded Plasmonic Antennas", Nano Letters, Feb. 26, 2013, vol. 13, No. 3, pp. 1257-1264, https://doi.org/10.1021/nl3047943.

Yao et al., "High responsivity mid-infrared graphene detectors with antenna enhanced photocarrier generation and collection", Nano Letters, vol. 14, No. 7, Jun. 18, 2014, pp. 3749-3754.

Yardimci et al., "High Sensitivity Terahertz Detection through Large-Area Plasmonic NanoAntenna Arrays", Scientific Reports, vol. 7, Article 42667, Feb. 16, 2017 (Feb. 16, 2017), pp. 1-8.

Yu et al., "A high performance, visible to mid-infrared photodetector based on graphene nanoribbons passivated with HfO2", Nanoscale, 2016, First Published Nov. 13, 2015, vol. 8, pp. 327-332, DOI: 10.1039/C5NR06869J.

Zhang et al., "Broadband high photoresponse from pure monolayer graphene photodetector", Nature Communications, vol. 4, No. 1811, May 7, 2013, pp. 1-11.

* cited by examiner

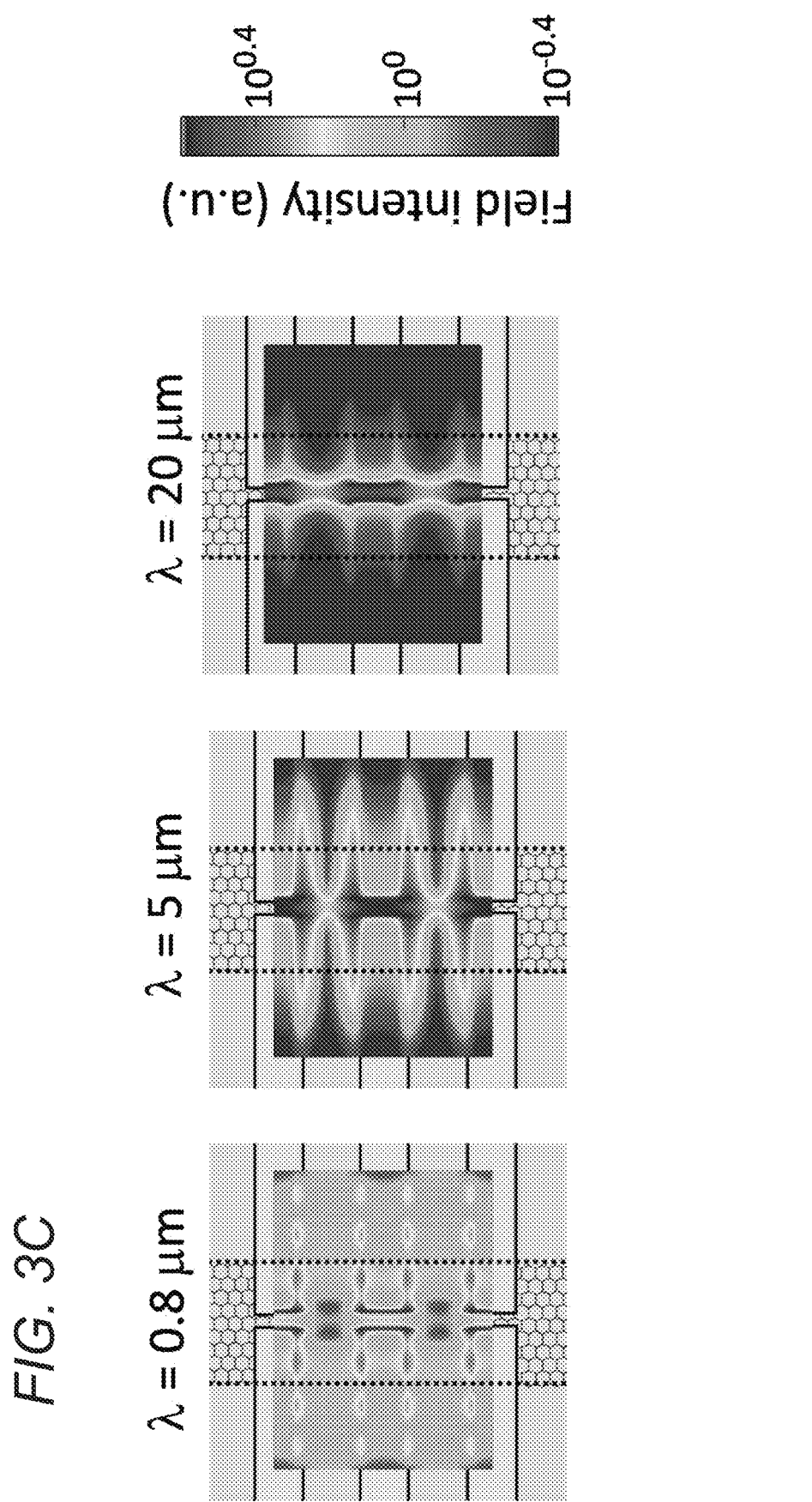

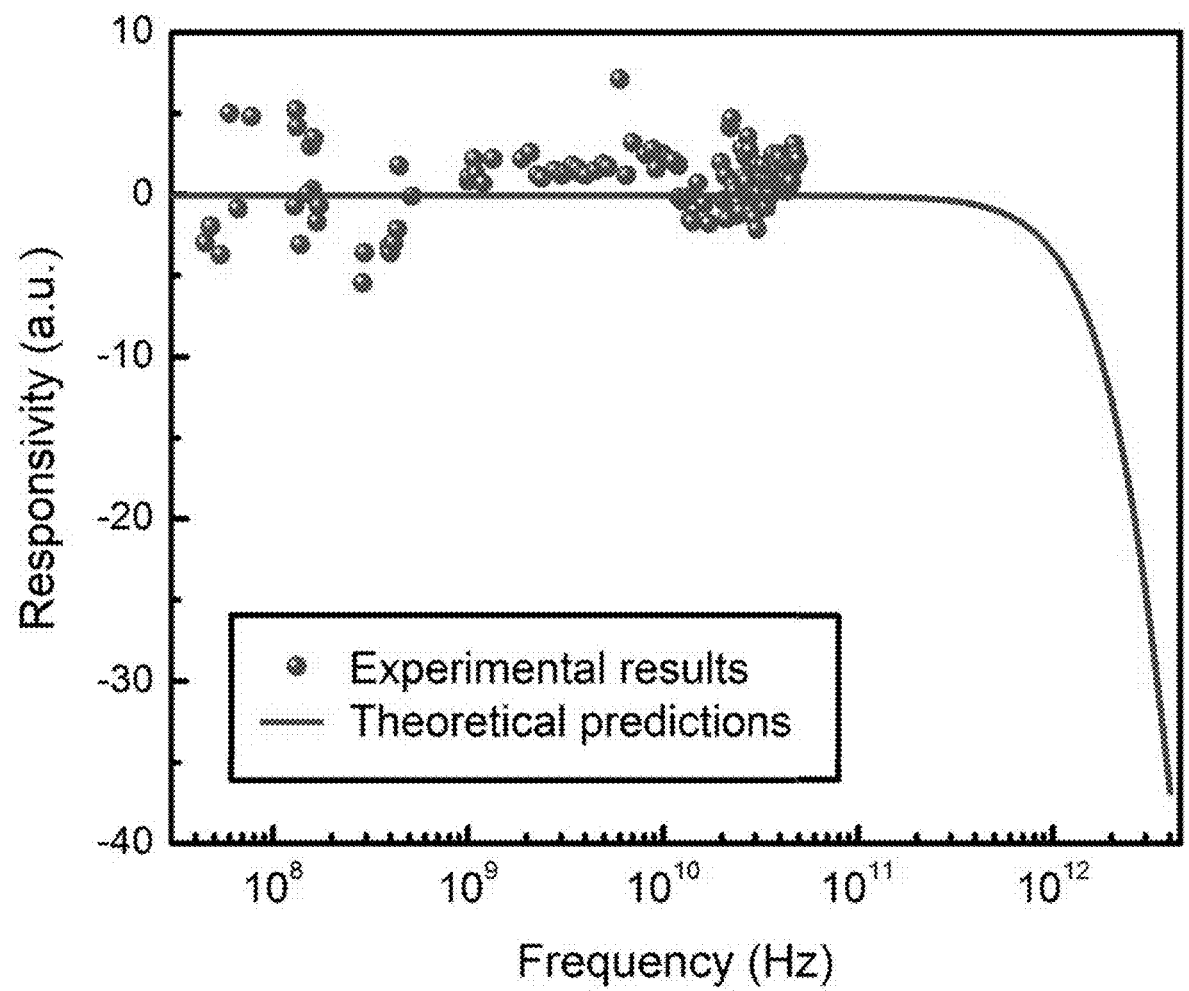

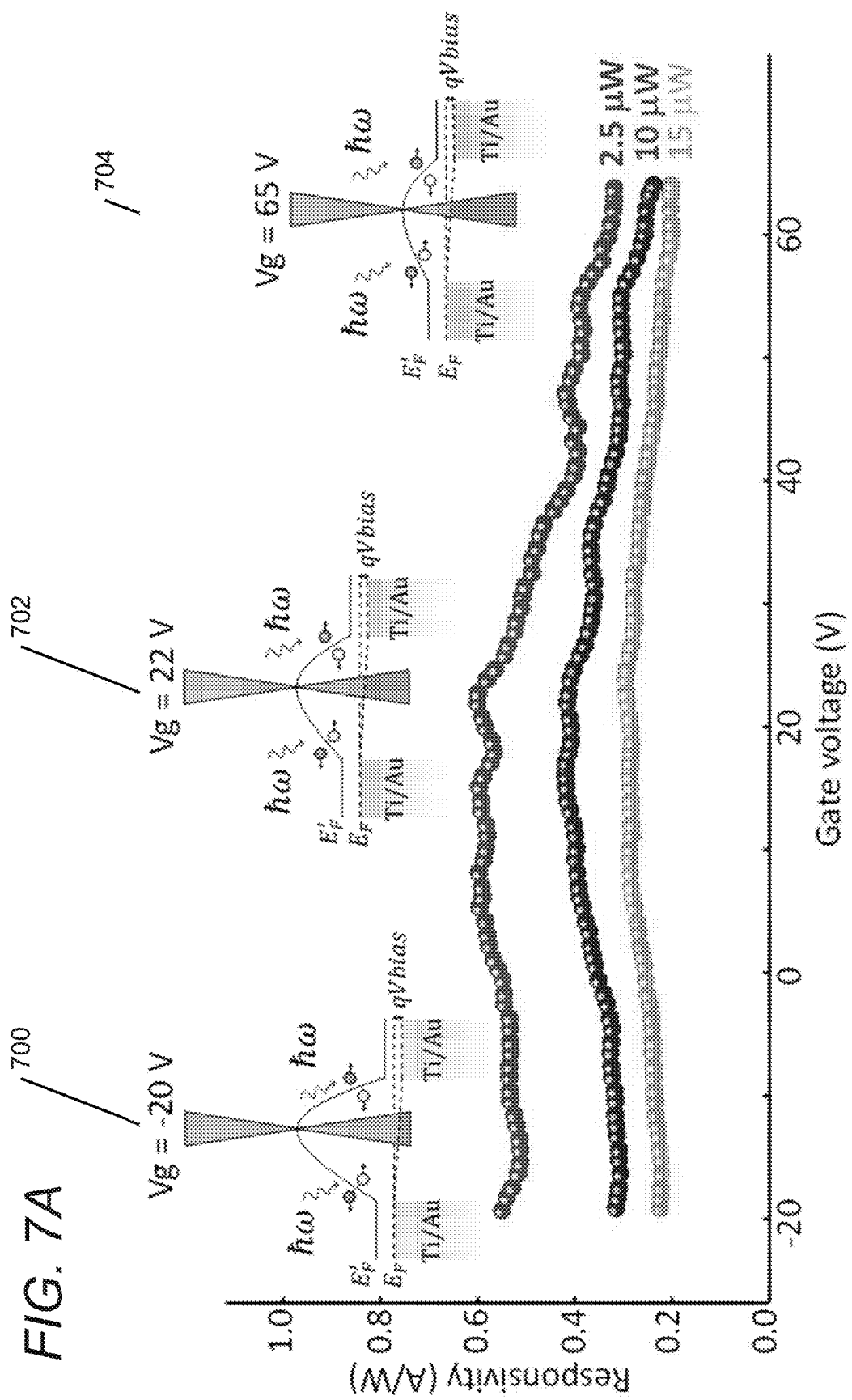

METALLO-GRAPHENE NANOCOMPOSITES AND METHODS FOR USING METALLO-GRAPHENE NANOCOMPOSITES FOR ELECTROMAGNETIC ENERGY CONVERSION

CROSS-REFERENCE TO RELATED APPLICATIONS

The current application is a national stage patent application of Application No. PCT/US2018/035707 entitled "Metallo-Graphene Nanocomposites and Methods for using Metallo-Graphene Nanocomposites for Electromagnetic Energy Conversion," filed Jun. 1, 2018, which claims the benefit of and priority under 35 U.S.C. § 119(e) to U.S. Provisional Patent Application No. 62/513,951 entitled "Systems and Methods for Infrared Detectors and Heat Recycling Cells Based on Metallo-Graphene Nanocomposites," filed Jun. 1, 2017 and U.S. Provisional Patent Application No. 62/514,668 entitled "Systems and Methods for Infrared Detectors and Heat Recycling Cells Based on Nanocomposites," filed Jun. 2, 2017. The disclosures of U.S. Provisional Patent Application Nos. 62/513,951 and 62/514,668 are hereby incorporated by reference in their entireties for all purposes.

STATEMENT REGARDING FEDERALLY SPONSORED RESEARCH OR DEVELOPMENT

This invention was made with government support under Grant No. DE-SC0016925, awarded by the Department of Energy. The government has certain rights in the invention.

FIELD OF THE INVENTION

The present invention generally relates to nanocomposites and, more specifically, to metallo-graphene nanocomposites and the use of such materials for the conversion of electromagnetic energy to electric current.

BACKGROUND

Photodetectors, or photosensors, are devices capable of detecting light or other electromagnetic energy. There are many different detection mechanisms. For example, one such mechanism includes the photoelectric effect, which is the effect of light shining on a material and causing electrons to be emitted. Carrier generation can occur and electron-hole pairs are created from the excitation of electrons from the valence band to the conduction band, which creates holes in the valence band. Recombination refers to the reverse process where the electrons and holes recombine and are annihilated. During the carrier generation and recombination processes, a current can be generated to allow for the detection of incident photons.

Photodetectors vary widely in their applications, which can range from communications to spectroscopy. Depending on the specific application, certain performance metrics can be of interest. For example, certain semiconductor-based photodetectors can be limited in their operation spectral range by their bandgap, which can result in non-operation at certain optical wavelengths. On the other hand, graphene is a zero bandgap semiconductor that has been investigated as a material for photo-detection owing to its high mobility, carrier multiplication capability, and broadband optical absorption from ultraviolet to microwave regimes. Carrier mobility in graphene can reach up to 200000 $cm^2/Vs$ and, unlike other semiconductors, both electrons and holes have equally high mobility values. Despite these exceptional properties, low optical absorption and the short carrier lifetime of graphene can limit the responsivity of graphene photodetectors. Moreover, the low resistivity of graphene can degrade power-efficiency and sensitivity of graphene photodetectors by introducing high dark current and noise current levels.

SUMMARY OF THE INVENTION

Many embodiments of the invention are directed towards nanocomposites capable of converting electromagnetic radiation to an electric signal, such as signals in the form of current or voltage. One embodiment includes a nanocomposite for converting electromagnetic radiation to an electric signal, the nanocomposite including a photo-absorbing layer of material selected from the group consisting of graphene, transition metal dichalcogenides, and black phosphorene, and at least one metallic nanostructure in contact with the photo-absorbing layer, wherein the at least one metallic nanostructure act as contact electrodes for the nanocomposite.

In another embodiment, the photo-absorbing layer is a multi-layered graphene layer.

In a further embodiment, the photo-absorbing layer includes graphene nanoribbons.

In still another embodiment, the photo-absorbing layer is doped in order to alter the Fermi energy level of the photo-absorbing layer.

In a still further embodiment, the photo-absorbing layer is doped in order to increase optical absorption of infrared wavelengths of the photo-absorbing layer.

In yet another embodiment, the at least one metallic nanostructure includes a plurality of nanostructures and the doping level of the photo-absorbing layer between the metallic nanostructures is different than at junctions of the metallic nanostructures.

In a yet further embodiment, the photo-absorbing layer is initially doped.

In another additional embodiment, the photo-absorbing layer is in contact with a dielectric and the photo-absorbing layer is doped using a gate voltage.

In a further additional embodiment, the nanocomposite further includes a semiconductor, wherein the photo-absorbing layer is in contact with the semiconductor, wherein the nanocomposite is configured to operate as a photodetector capable of detecting a wavelength range from ultraviolet wavelengths to microwave wavelengths.

In another embodiment again, the semiconductor includes a silicon wafer having a silicon oxide layer.

In a further embodiment again, the at least one metallic nanostructure and the photo-absorbing layer are configured to generate electron-hole pairs in the photo-absorbing layer in close proximity to the at least one metallic nanostructure when the photo-absorbing layer receives incident light.

In still yet another embodiment, the nanocomposite is capable of operating in wavelength ranging from about 800 nanometers to about 20 micrometers with responsivity levels ranging from at least 0.6 A/W.

In a still yet further embodiment, the nanocomposite is capable of operating at over 50 GHz.

In still another additional embodiment, the nanocomposite is capable of operating without a bias voltage.

In a still further additional embodiment, the nanocomposite is capable of operating with a responsivity level of at least 0.1 A/W.

In still another embodiment again, the nanocomposite further includes a dielectric with a backside semiconductor or conductor for gating the photo-absorbing layer and adjusting the Fermi energy level of the photo-absorbing layer.

In a still further embodiment again, the nanocomposite further includes a dielectric layer in contact with a heat absorber layer, wherein the dielectric layer and the heat absorber layer are configured to direct infrared radiation toward the photo-absorbing layer.

In yet another additional embodiment, the at least one metallic nanostructure includes electrically-connected metallic nanoparticles.

In a yet further additional embodiment, the at least one metallic nanostructure includes plasmonic nanoantennas.

In yet another embodiment again, the electrically-connected metallic nanoparticles include an array of electrically-connected nanoscale gold patches.

In a yet further embodiment again,

In another additional embodiment again, the at least one metallic nanostructure includes a plurality of metallic nanostructures that are placed in an asymmetric pattern.

In a further additional embodiment again, the at least one metallic nanostructure includes a grating pattern.

In still yet another additional embodiment, the grating pattern has fringes with widths of ~100 nm, periodicity of ~200 nm, height of ~50 nm, length of ~1 μm, and a tip-to-tip gap size of ~50 nm.

In a still yet further additional embodiment, at least one metallic nanostructure includes a metallic sheet defining a plurality of apertures.

In yet another additional embodiment again, the nanocomposite further includes a metallic reflector placed relative to the at least one metallic nanostructure.

In a yet further additional embodiment again, the nanocomposite further includes a semiconductor layer or a dielectric layer that separates the metallic reflector and the at least one metallic nanostructure.

In still yet another embodiment again, the nanocomposite is capable of converting thermal energy into an electric signal.

In a still yet further embodiment again, the photo-absorbing layer is configured to generate carriers in response to receiving thermal energy.

Additional embodiments and features are set forth in part in the description that follows, and in part will become apparent to those skilled in the art upon examination of the specification or may be learned by the practice of the invention. A further understanding of the nature and advantages of the present invention may be realized by reference to the remaining portions of the specification and the drawings, which forms a part of this disclosure.

BRIEF DESCRIPTION OF THE DRAWINGS

The description will be more fully understood with reference to the following figures and data graphs, which are presented as exemplary embodiments of the invention and should not be construed as a complete recitation of the scope of the invention.

FIG. 3C shows a color plot of the transmitted optical field through gold patches at wavelengths of 0.8 μm, 5 μm, and 20 μm for an incident optical beam polarized normal to graphene nanoribbons in accordance with an embodiment of the invention.

FIG. 6D shows a graph illustrating the predicted and measured responsivity values as a function of optical beating/modulation frequency of a metallo-graphene nanocomposite photodetector in accordance with an embodiment of the invention.

FIG. 7A shows a graph illustrating the responsivity of a fabricated metallo-graphene nanocomposite photodetector at a wavelength of 800 nm when the gate voltage is varied between −20 V and 65 V in accordance with an embodiment of the invention.

DETAILED DESCRIPTION

Figure 1A:
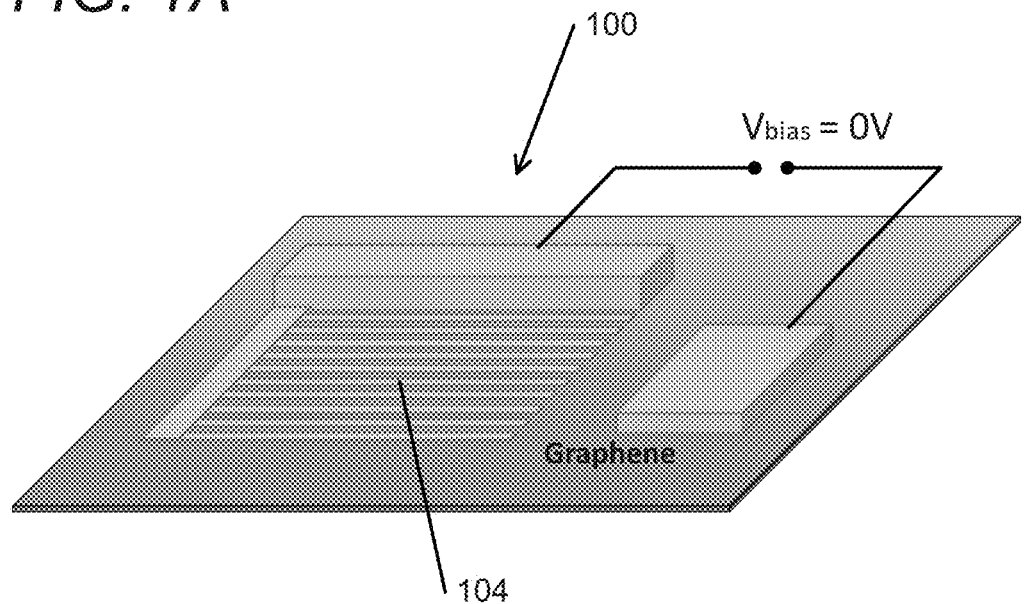
FIGS. 1A-1B conceptually illustrate metallo-graphene nanocomposites with different nanostructure geometries that can convert electromagnetic energy to electric current in accordance with an embodiment of the invention.

Turning now to the drawings, metallo-graphene nanocomposites that can convert electromagnetic energy to an electric signal and methods of manufacturing metallo-graphene nanocomposites in accordance with various embodiments of the invention are illustrated. Metallo-graphene nanocomposites in accordance with many embodiments of the invention can be packaged to produce devices suitable for use in a variety of optoelectronic applications, such as (but not limited to) photovoltaics, metamaterials, transparent electrodes, saturable absorbers, chemical sensors, and photodetectors. In many embodiments, metallo-graphene nanocomposites can be defined as nanocomposites fabricated with a graphene layer for use as a photo-absorbing material. In some embodiments, the graphene layer is a monolayer. In other embodiments, the graphene layer is multi-layered. In a number of embodiments, the graphene layer is placed on a dielectric with a backside semiconductor or conductor for gating the graphene and adjusting its Fermi energy level. Although the discussions throughout this present disclosure may discuss metallo-graphene nanocomposites that use graphene as a photo-absorbing material, any other suitable photo-absorbing material can replace graphene, which can depend on the specific requirements of a given application. Other photo-absorbing materials can include (but not limited to) multi-layered graphene, transition metal dichalcogenide ("TMDC"), black phosphorene, and various two-dimensional materials.

In a variety of embodiments, metallic nanostructures, which can act as the device contact electrodes, are integrated with a graphene sheet to form a metallo-graphene nanocomposite. In various embodiments, electrically-connected metallic nanoparticles are deposited on the top and/or bottom of the graphene layer and serve as the device contact electrodes. In some embodiments, nano-grating contact electrodes are integrated. Any of a number of methods can be used to integrate nanostructures with a graphene sheet, such as (but not limited to) deposition, coating, and lift-off techniques.

Graphene has been an attractive material for broadband and ultrafast photodetection because of its distinct optical and electronic characteristics. These characteristics stem, at least in part, from the unique band structure of graphene, which allows carrier generation by optical absorption over an extremely broad spectral range, typically from the ultraviolet to the microwave regimes. Moreover, high electron/hole mobility and weak scattering in graphene can enable ultrafast temporal responses in graphene photodetectors. The two-dimensional nature of graphene can enable the generation of multiple electron/hole pairs for a single absorbed photon. Furthermore, the compatibility of graphene photodetectors with silicon-based fabrication platforms can enable their integration with low-cost and high-performance complementary metal oxide semiconductor ("CMOS") read-out and post-processing circuits.

Most graphene photodetectors utilize graphene-metal junctions or graphene p-n junctions to spatially separate and extract the photogenerated carriers. A low optical absorption inside the effective junction regions (~100-200 nm) and short photocarrier lifetime of graphene (~1 ps) have been two major challenges for developing high-responsivity graphene photodetectors, and the scope and potential use of conventional graphene photodetectors remain limited by the tradeoffs between their high responsivity, ultrafast temporal responses, and broadband operation. Furthermore, as a result of these limitations, only the photocarriers generated in close proximity to the photodetector contact electrodes are typically routed to the photodetector output.

Metallo-graphene nanocomposites in accordance with many embodiments of the invention are implemented for a wide variety of applications, including (but not limited to) photodetectors and energy conversion devices. In some embodiments, metallo-graphene nanocomposites are constructed with metallic nanostructures designed as contact electrodes that can allow for photocarriers generated in close proximity to the electrodes to be collected in response to incident electromagnetic radiation over a broad wavelength range, allowing for high responsivity and high-speed photodetection over such range. Use of metallic nanostructures as contact electrodes can provide a strong concentration of photo-generated carriers near the contact electrodes. As a result, a large number of photocarriers can drift to the contact electrodes despite the short carrier lifetime of graphene, providing high responsivity levels. Although the present disclosure discusses the use of metallo-graphene nanocomposites in the context of converting electromagnetic radiation into an electric signal, the underlying principles and concepts can also apply to thermal generation of carriers that can result in producing an electric signal. For example, in many embodiments, metallo-graphene nanocomposites can be implemented in devices that can thermally conduct heat from an external source to the metallo-graphene nanocomposite to produce an electric signal. Metallo-graphene nanocomposites and methods of manufacturing graphene-based nanocomposites in accordance with various embodiments of the invention are discussed below in further detail.

Metallo-Graphene Nanocomposites

Many embodiments of the invention are directed towards nanocomposites capable of converting electromagnetic radiation to an electric signal, such as signals in the form of current or voltage. In some embodiments, metallic nanostructures are integrated with graphene material to form a metallo-graphene nanocomposite. Graphene is a material that has been explored for broadband and ultrafast photodetection applications because of its distinct optical and electronic characteristics. However, the low optical absorption and the short carrier lifetime of graphene can limit its use in many applications. Nanocomposites in accordance with various embodiments of the invention integrates metallic nanostructures, such as (but not limited to) plasmonic nanoantennas and metallic nanoparticles, with a graphene-based material to form metallo-graphene nanostructures that can offer high responsivity, ultrafast temporal responses, and broadband operation in a variety of optoelectronic applications. The metallo-graphene nanocomposite can also be designed to offer high-speed operation by minimizing capacitive parasitics. In many embodiments, the graphene layer is doped to adjust the Fermi level. In some embodiments, metallo-graphene nanocomposites are constructed for efficient extraction of photo-generated carriers with no external bias voltage. In several embodiments, bias-free metallo-graphene nanocomposites are based on plasmonic nano-gratings, which can enable efficient optical coupling.

In several embodiments, the metallic nanostructures are designed such that most of the photocarriers are generated near the contact electrodes in response to an incident optical beam. These photoconductive nanostructures can constrain most of the photocarrier generation and conduction to the graphene nanoribbons and gold patches, respectively. These nanostructures can also allow for the merging of the advantages of broadband optical absorption, ultrafast photocarrier transport, and carrier multiplication within the graphene nanoribbons with the ultrafast transport of photocarriers to gold patches before recombination. In other words, the nanostructures can benefit from the broadband optical absorption and photocarrier multiplication capabilities of graphene while avoiding the negative effects of the short photocarrier lifetime of graphene. Through this approach, high-responsivity operation can be realized without the use of bandwidth- and speed-limiting quantum dots, defect states, and/or tunneling barriers as relied upon by other graphene-based devices discussed in the scientific literature. Optical absorption in graphene is typically dominated by interband transitions in the visible and near-infrared spectral ranges and by intraband transitions in the infrared spectral range. The intraband and interband transitions in graphene can be modified through electrostatic gating. Optical absorption of the graphene can be strongly controlled by changing its doping level. Changing the doping level of the graphene can increase optical absorption. In a number of embodiments, a specific gate voltage can be used to tune the carrier concentration and Fermi energy level of the graphene. In some embodiments, the graphene is formed on top of a dielectric and the gate voltage can be used to control the doping of the graphene, where the band-bending slope can be modified depending on the value of the gate voltage. As discussed above, the graphene can be formed on silicon dioxide. Other dielectrics that can be used include (but are not limited to) silicon nitride, aluminum dioxide, different types of plastics and polymers, and various other materials. When an optical beam is incident on the metallo-graphene nanocomposite, the photogenerated electrons and holes can move according to the induced electric field determined by the band-bending slope. In several embodiments, the gate voltage is chosen to produce a steep band-bending slope. In a number of embodiments, the graphene is initially doped. Doped graphene can be formed on various types of materials, including but not limited to semiconductors and dielectrics, such as those discussed above. Various types of semiconductor materials can be used, such as (but not limited to) silicon, germanium, silicon-germanium, silicon carbide, etc.

The doping level of the graphene can also depend on the manner in which the graphene and nanostructures are formed. Metallic nanostructures in accordance with various embodiments of the invention can change locally the doping level of the graphene. The doping level of the graphene can determine the Fermi energy level of graphene between the metallic nanostructures, but the metal-induced doping level sets a different Fermi energy level at the metallic nanostructures junctions. This can result in a band-bending near the metallic nanostructures. By carefully adjusting the doping level of the graphene sheet and the geometry of the nanostructures, the band-bending slope can be adjusted to maximize the number of the electrons drifting within the graphene to the metallic nanostructures while repelling the holes away from the metallic nanostructures. In some embodiments, doping levels are chosen to produce a steep band-bending slope. As can readily be appreciated, the formation of the graphene and nanostructures can be chosen to achieve a particular doping level, which can depend on the specific requirements of a given application.

In some embodiments, the metallo-graphene nanocomposites are based on gold-patched graphene nanoribbons, which can offer unique electrical and optical characteristics that enable simultaneous broadband and ultrafast photodetection with high responsivity. In many embodiments, a metallo-graphene nanocomposite can incorporate electrically-connected nanostructures. In several embodiments, the metallo-graphene nanocomposite includes an array of electrically-connected nanoscale gold patches. Electrically-connected nanostructures in metallo-graphene nanocomposites can be implemented in many different ways. Different patterns can be implemented, which can affect the performance of the device. In some embodiments, a grating pattern is implemented. In a number of embodiments, metallo-graphene nanocomposites are fabricated with nanostructures laid out in a periodic pattern. In other embodiments, the nanostructures are in a non-periodic pattern. Both symmetric and asymmetric patterning of nanostructures can be implemented. Distances between components of the nanostructures within the pattern can vary and can also affect the performance of the device. Furthermore, the nanostructures themselves can be formed with different geometries, such as (but not limited to) globular, rectangular, square, split ring, H-shape, C-shape, and a variety of other geometries.

Figure 1B:
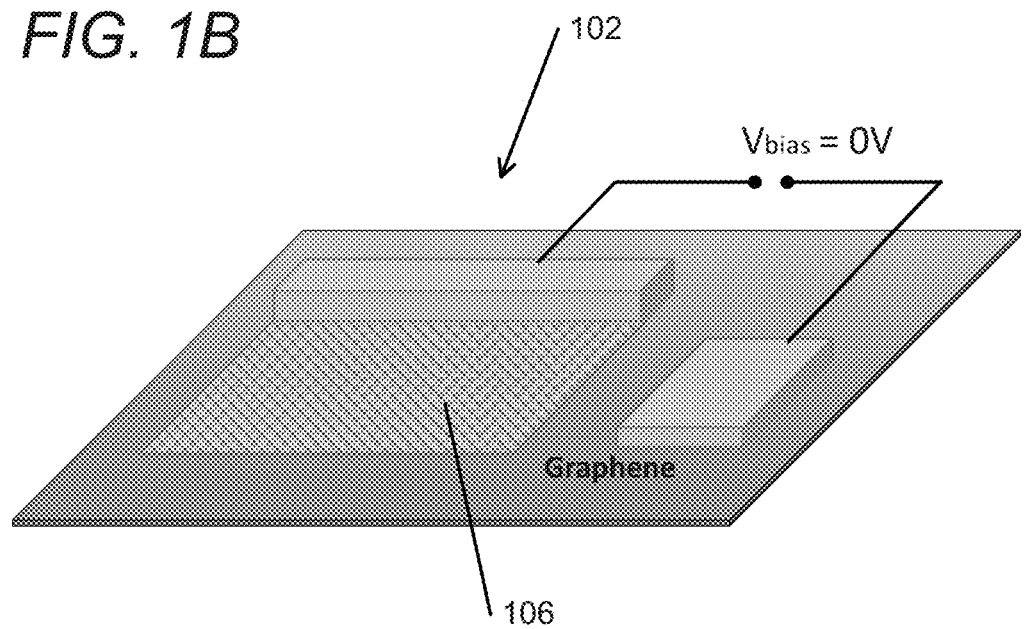
Figure 2:
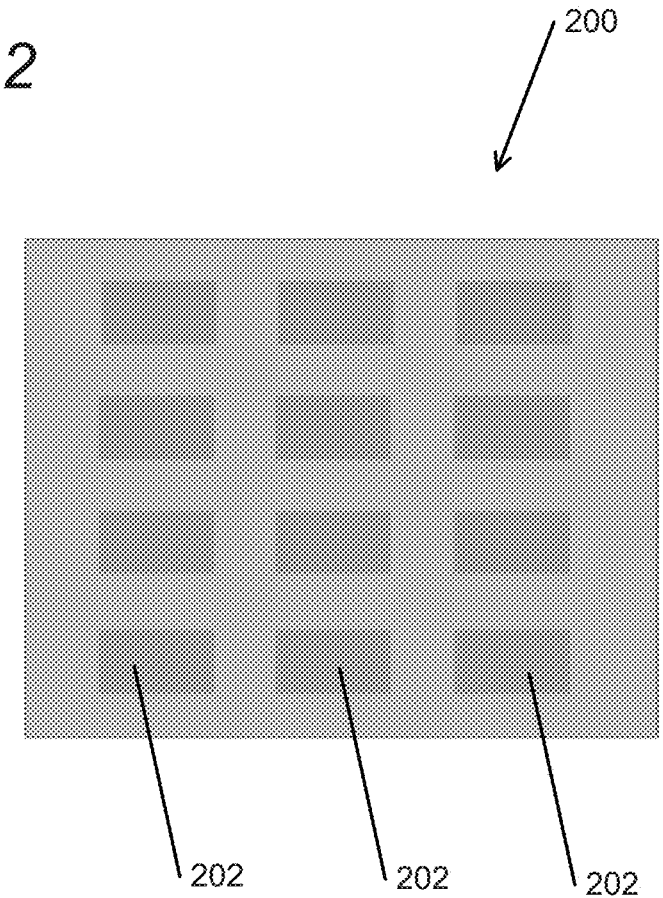
FIG. 2 conceptually illustrates a metal sheet with periodic rectangular apertures in accordance with an embodiment of the invention.

FIGS. 1A and 1B conceptually illustrate metallo-graphene nanocomposites with different patterns of nanostructures in accordance with various embodiments of the invention. As shown, the metallo-graphene nanocomposites 100, 102 are bias-free implementations. Metallo-graphene nanocomposite 100 includes nanostructures in a grating pattern 104, and metallo-graphene nanocomposite 102 includes an array 106 of globular nanostructures. In many embodiments, metallic sheets with periodic or non-periodic patterns or arrays of apertures can be implemented on a graphene layer to form a metallo-graphene nanocomposite. The shapes of the apertures can vary and can include the shapes discussed above. In some embodiments, a metallic reflector is placed beneath the metallic sheet to increase absorption. For example, in embodiments where the metallo-graphene nanocomposite is formed on a silicon wafer with a silicon oxide layer, the metallic reflector can be placed on the backside of the silicon oxide layer or the backside of the silicon wafer. In further embodiments, a dielectric layer or a dielectric/polymer layer is placed between the graphene and the metallic reflector. FIG. 2 conceptually illustrates a metal sheet with periodic rectangular apertures in accordance with an embodiment of the invention. As shown, the metal sheet 200 includes apertures 202 that are designed to be of a specific size and spaced a specific distance apart.

Although FIGS. 1A, 1B, and 2 show specific patterns of nanostructures, any of a number of different patterns and sizes of nanostructures can be implemented as appropriate to the specific requirements of a given application. In a number of embodiments, the feature size, shape, and periodicity of the patterned nanostructures are chosen to achieve maximum electromagnetic absorption inside the graphene. In many embodiments, the patterns of the nanostructures are designed with geometries that can depend on various properties of the graphene, such as (but not limited to) the carrier lifetime in the graphene. In some embodiments, the pattern of nanostructure is designed with periodic or aperiodic structures. In further embodiments, the structures have a minimum feature size that can depend on the specific application. Minimum feature sizes can vary widely. In many applications, the minimum feature size ranges from anywhere between 10 nm and 1 µm. In several embodiments, the metal-to-metal spacing of the pattern of the nanostructures is at the sub-micrometer level. The specific distance of the spacing largely depends on the requirements of a given application. In several embodiments, the metal-to-metal spacing is less than 500 nm. In a variety of embodiments, the metal-to-metal spacing is less than 100 nm. In further embodiments, the metal-to metal spacing is less than 50 nm.

Metallo-graphene nanocomposites in accordance with various embodiments of the invention can be designed to reduce carrier transport path lengths from the graphene to the nanostructures. In many embodiments, the specific pattern of nanostructures within the metallo-graphene nanocomposite can be designed with dimensions that are typically dictated by the wavelengths of electromagnetic energy relevant to a particular application. In further embodiments, dimensions of the nanostructures are chosen to help achieve high responsivity. Nanostructures can be implemented in metallo-graphene nanocomposites on a subwavelength scale. In some embodiments, the geometries and dimensions of the nanostructures are designed to confine most of the photocarrier generation and conduction to the graphene and nanostructures, respectively. In a number of embodiments, the nanostructures are patterned as gratings with widths of ~10 nm-10 um, periodicity of ~20 nm-10 um, height of ~5 nm-1 um, length of ~100 nm-1 cm, and a tip-to-tip gap size of ~10 nm-1 um. The dimensions of the nanostructures can vary depending on the specific requirements of a given application.

Metallo-graphene nanocomposites in accordance with various embodiments of the invention can perform in different ways with respect to certain performance metrics depending on their specific constructions. In several embodiments, metallo-graphene nanocomposites are capable of broadband photodetection operation covering the wavelength regime from ~800 nm to ~20 µm with responsivity levels ranging from more than 0.5 Amperes per watt (A/W) to more than 10 A/W, respectively. In many embodiments, metallo-graphene nanocomposites are designed for specific applications. Such designs can be tuned with certain operational parameters, which can depend on the specific application. In several embodiments, metallo-graphene nanocomposites are capable of broadband photodetection operation covering the frequency regime from ~50 GHz to ~10 THz with responsivity levels ranging from more than 10 Amperes per watt (A/W) to more than 1 A/W, respectively. In several embodiments, metallo-graphene nanocomposites are capable of broadband operation. In some embodiments, the metallo-graphene nanocomposites are capable of operating from the ultraviolet to the microwave range of the electromagnetic spectrum. Depending on the specific application, such nanocomposites can be designed to operate within a range of the electromagnetic spectrum. In a number of embodiments, the metallo-graphene nanocomposites can be tuned to be sensitive to particular spectral bands. As is discussed further below, metallo-graphene nanocomposites in accordance with various embodiments of the invention can be implemented as phototransistors. In some embodiments, metallo-graphene nanocomposites are implemented as photodiodes. In many embodiments, a metallo-graphene nanocomposite is packaged and implemented as a photoconductor. A few examples of different optoelectronic applications of metallo-graphene nanocomposites are discussed below in further detail.

Photodetectors Incorporating Metallo-Graphene Nanocomposites

Photodetectors constructed using graphene-based nanocomposites in accordance with many embodiments of the invention can achieve high responsivity, broadband, and/or high-speed photodetection. Photodetectors can be used for a wide range of applications and can be constructed and packaged in many different ways. As such, operational parameters can change depending on the specific application. For example, in some applications, the photodetector is designed for low intensity signal applications, and photon sensitivity of the device is of significance. In several embodiments, the metallo-graphene nanocomposite photodetector is constructed with a small active area. In a number of applications, large active areas and low noise levels are ideal. Metallo-graphene nanocomposites can be implemented as phototransistors. In some embodiments, metallo-graphene nanocomposites are implemented as photodiodes.

In many embodiments, a metallo-graphene nanocomposite-based photodetector is implemented with plasmonic nanoantennas. In several embodiments, metallo-graphene nanocomposites can utilize gold-patched graphene nanoribbons to enable simultaneous broadband and ultrafast photodetection with high responsivity. In some embodiments, a photodetector utilizing a metallo-graphene nanocomposite is capable of broadband photodetection operation covering the wavelength regime from 800 nm to 20 µm with responsivity levels ranging from 0.6 amperes per watt (A/W) to 11.5 A/W. In several embodiments, the photodetector is capable of bias-free and passive operation. Depending on the specific application, photodetectors in accordance with various embodiments of the invention can be designed for specific ranges of wavelengths, which can range from the ultraviolet to terahertz regimes. In a number of embodiments, the photodetector operates at speeds exceeding 50 GHz. One of the unique features of gold-patched graphene nanoribbons is that they can exploit enhanced carrier multiexcitation generation at higher photon energy levels to compensate for the lower optical absorption at lower wavelengths. Such carrier multiplication factors typically have not been previously exploited in monolayer graphene photodetectors without the use of quantum dots because of the short photocarrier lifetimes in graphene. However, carrier multiplication factors can be used to boost the photoconductive gain of the gold-patched graphene nanoribbons at lower wavelengths because of the fast photocarrier transport time to the gold patches. Because the use of any defect states and/or quantum dots is avoided, the utilized gold-patched graphene nanoribbons can enable high responsivity photodetection without sacrificing the broadband and ultrafast operation. The combination of broadband and ultrafast photodetection with high responsivity enabled by the gold-patched graphene nanoribbons can have a significant impact on hyperspectral imaging and sensing systems.

Figure 3A:
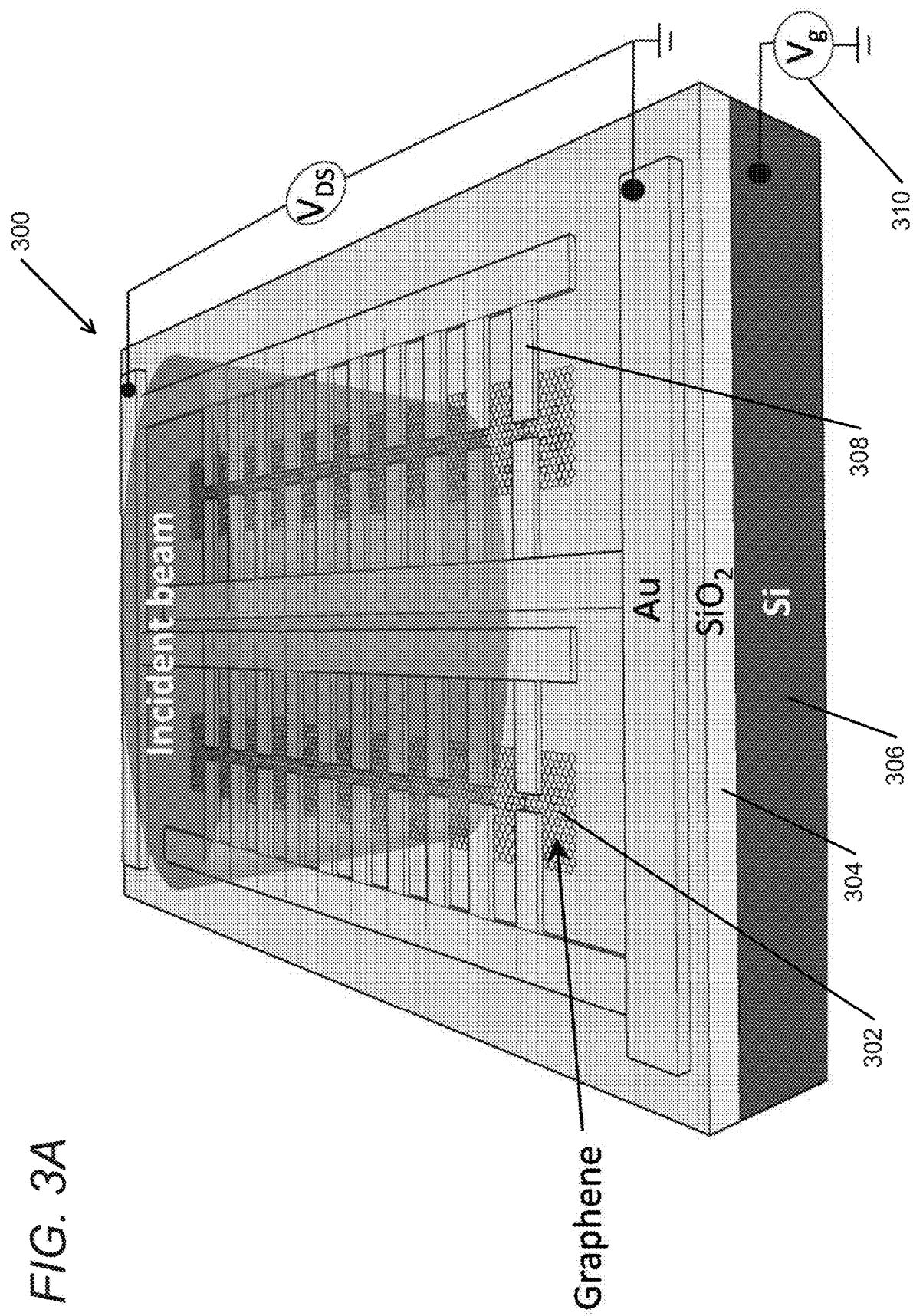
FIG. 3A conceptually illustrates a metallo-graphene nanocomposite photodetector based on gold-patched graphene nanoribbons in accordance with an embodiment of the invention.
Figure 3B:
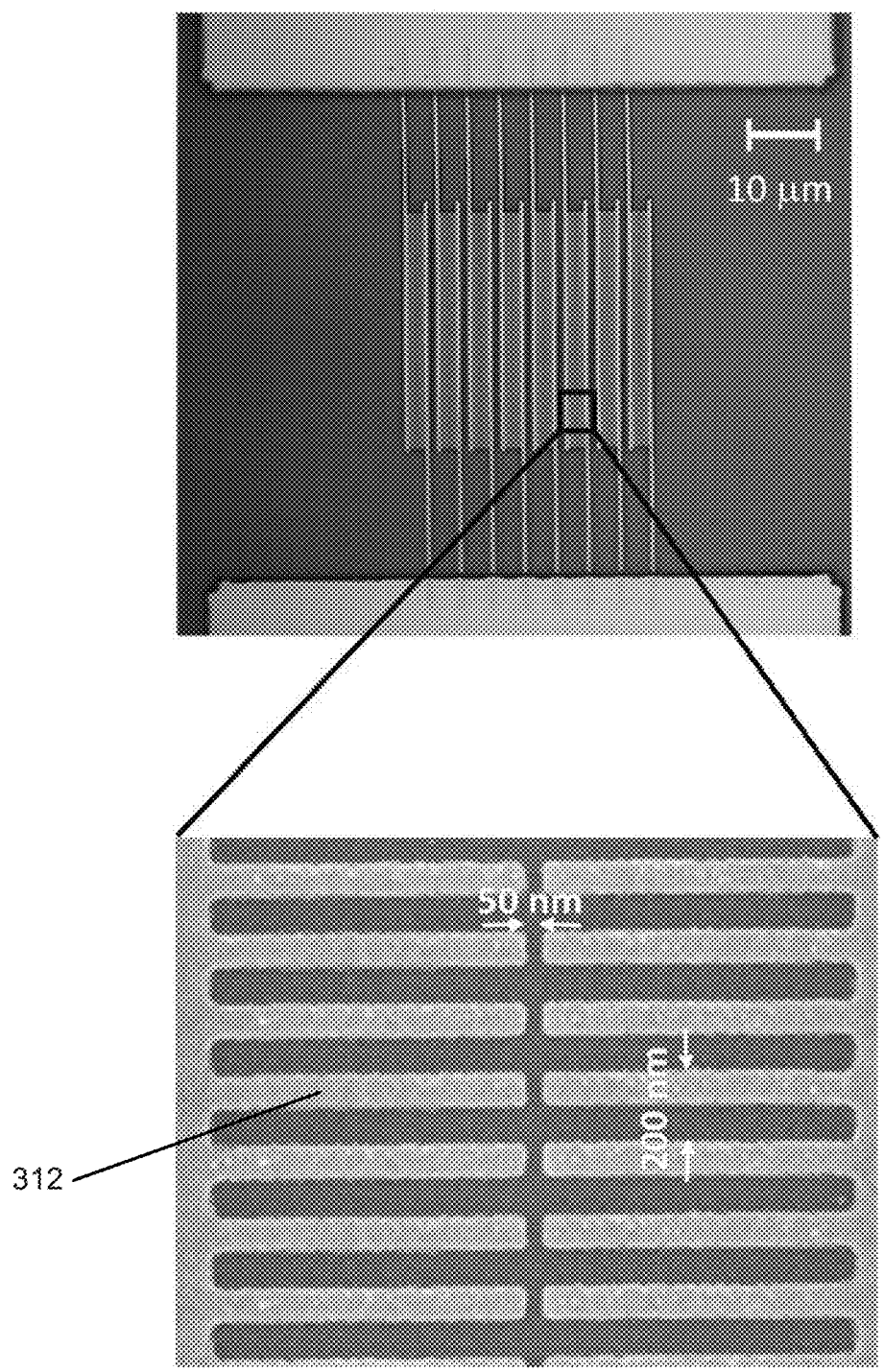
FIG. 3B shows the optical and scanning electron microscope images of a metallo-graphene nanocomposite photodetector based on gold-patched graphene nanoribbons with a 30×30 μm² active area in accordance with an embodiment of the invention.

A schematic illustration of a graphene photodetector based on a metallo-graphene nanocomposite incorporating gold-patched graphene nanoribbons in accordance with an embodiment of the invention is illustrated in FIG. 3A. In the illustrative embodiment, the photodetector 300 takes the form of a phototransistor. As shown, the photodetector 300 includes a graphene monolayer 302 placed on a thermal oxide layer 304, such as (but not limited to) a $SiO_2$ layer, formed on a highly resistive, such as >10 kΩ·cm, Si substrate 306. The photodetector 300 further includes arrays of dipole plasmonic nanoantennas 308 serving as the source/drain contacts while the Si substrate 306 serves as the gate electrode. The gate voltage 310 applied to the Si substrate, $V_g$, can control the Fermi energy level of the graphene nanoribbons. FIG. 3B shows the optical and scanning electron microscope images of a fabricated device with a 30×30 $\mu m^2$ active area in accordance with an embodiment of the invention. In the illustrative embodiment, the plasmonic nanoantennas 312 have a width of ~100 nm, periodicity of ~200 nm, height of ~50 nm, length of ~1 µm, and tip-to-tip gap size of ~50 nm.

In many embodiments, the photoconductive nanostructures are formed by connecting arrays of nanoscale gold patches, which serve as the source/drain contacts, to either side of the graphene nanoribbons. The geometry of the gold patches can be engineered to concentrate a major portion of the incident optical beam onto the graphene nanoribbons to generate a large number of electron-hole pairs in close proximity to the source/drain contact electrodes. The gold patches can also be designed to offer high photocarrier concentration near the contact electrodes over a broad optical bandwidth. When the incident optical beam is absorbed by the graphene, the generated electrons move toward the source/drain contact electrodes and the generated holes move in the opposite direction, toward the center gap. As a result, a photocurrent proportional to the difference between the collected electrons by the source and drain contacts can be induced. Graphene band-bending near the source and drain contacts can determine the difference between the photo-generated electrons moving toward the source and drain contacts and the output photocurrent, consequently. By an appropriate combination of voltages applied between the drain and contacts, $V_{DS}$, and the gate electrode, $V_g$, graphene band-bending near the source and drain contacts can be controlled to maximize the output photocurrent. In some embodiments, the graphene nanoribbons are designed to be narrower than the effective metal-graphene junction regions, where the photogenerated electron and holes separate. This design can enable a fast photocarrier transit time to the gold patches under an applied bias-voltage, and this transit time can be much faster than the graphene photocarrier lifetime. The photocarriers transported to the gold patches are all combined to form the output photocurrent of the photodetector.

Figure 3D:
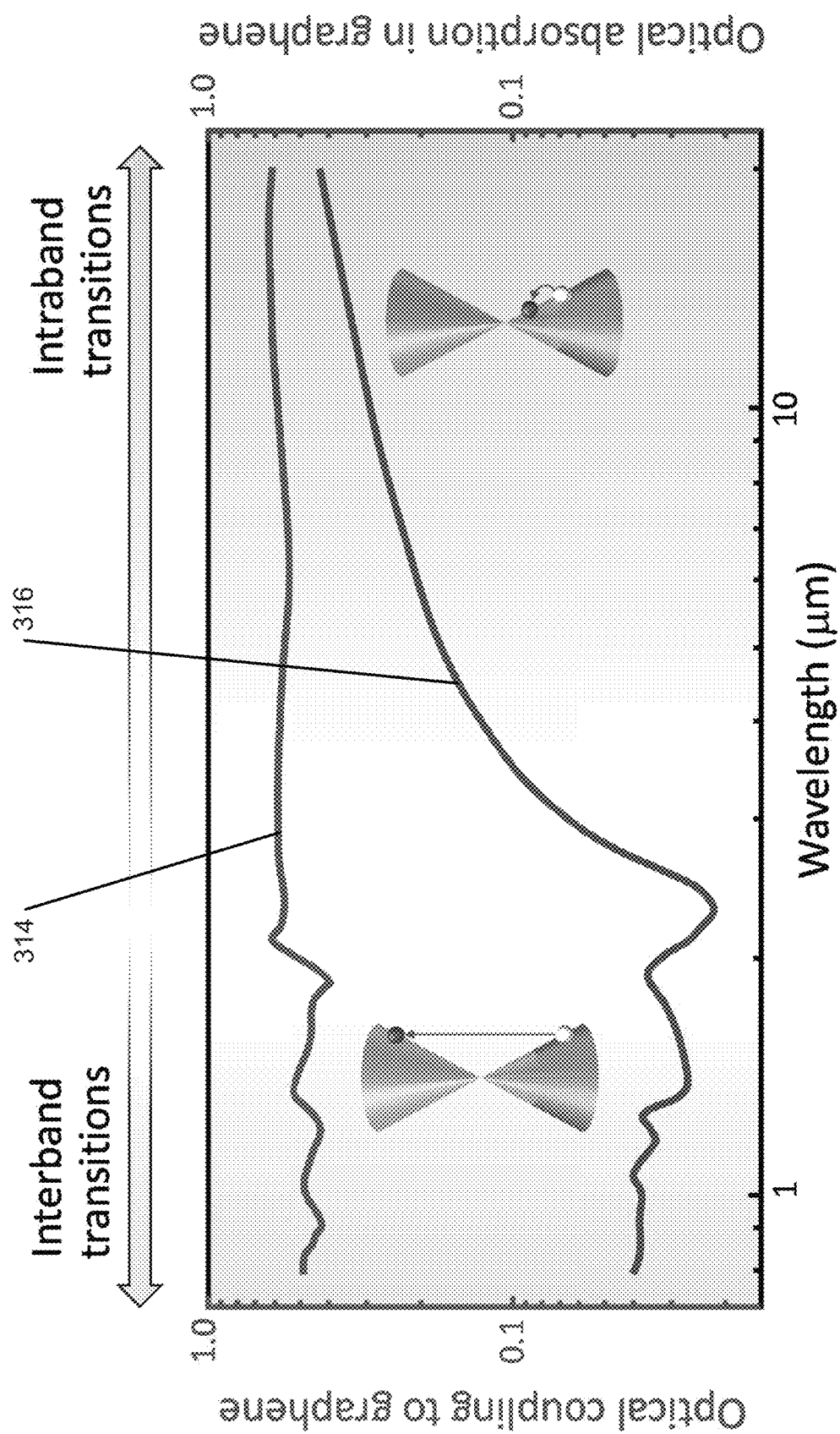
FIG. 3D shows a graph illustrating numerical estimates of the optical coupling and optical absorption as a function of the wavelength in graphene nanoribbons in accordance with an embodiment of the invention.

Numerical finite difference time domain simulations were carried out to analyze optical interaction with the designed nano-grating and graphene in the illustrative embodiment. FIG. 3C shows a color plot of the transmitted optical field through gold patches at wavelengths of 0.8 µm, 5 µm, and 20 µm for an incident optical beam polarized normal to graphene nanoribbons in accordance with an embodiment of the invention. As shown, the color plot indicates highly efficient and broadband optical coupling to the graphene nano-stripes. FIG. 3D shows a graph illustrating numerical estimates of the optical coupling (top curve 314) and optical absorption (bottom curve 316) in the graphene nanoribbons as a function of the wavelength. The numerical analysis predicts that 40%-60% of the incident optical beam would be focused onto the graphene nanoribbons over a broad spectrum ranging from the visible to infrared regimes, as illustrated in the top curve. Despite the broadband optical coupling to the graphene nanoribbons, the optical absorption in graphene is estimated to be highly wavelength dependent, as illustrated in the bottom curve. This strong wavelength dependence can stem from the optical absorption in graphene being dominated by interband transitions in the visible and near-infrared spectral ranges and by intraband transitions in the infrared spectral range, leading to much lower optical absorption in the visible and near-infrared regimes.

Figure 3E:
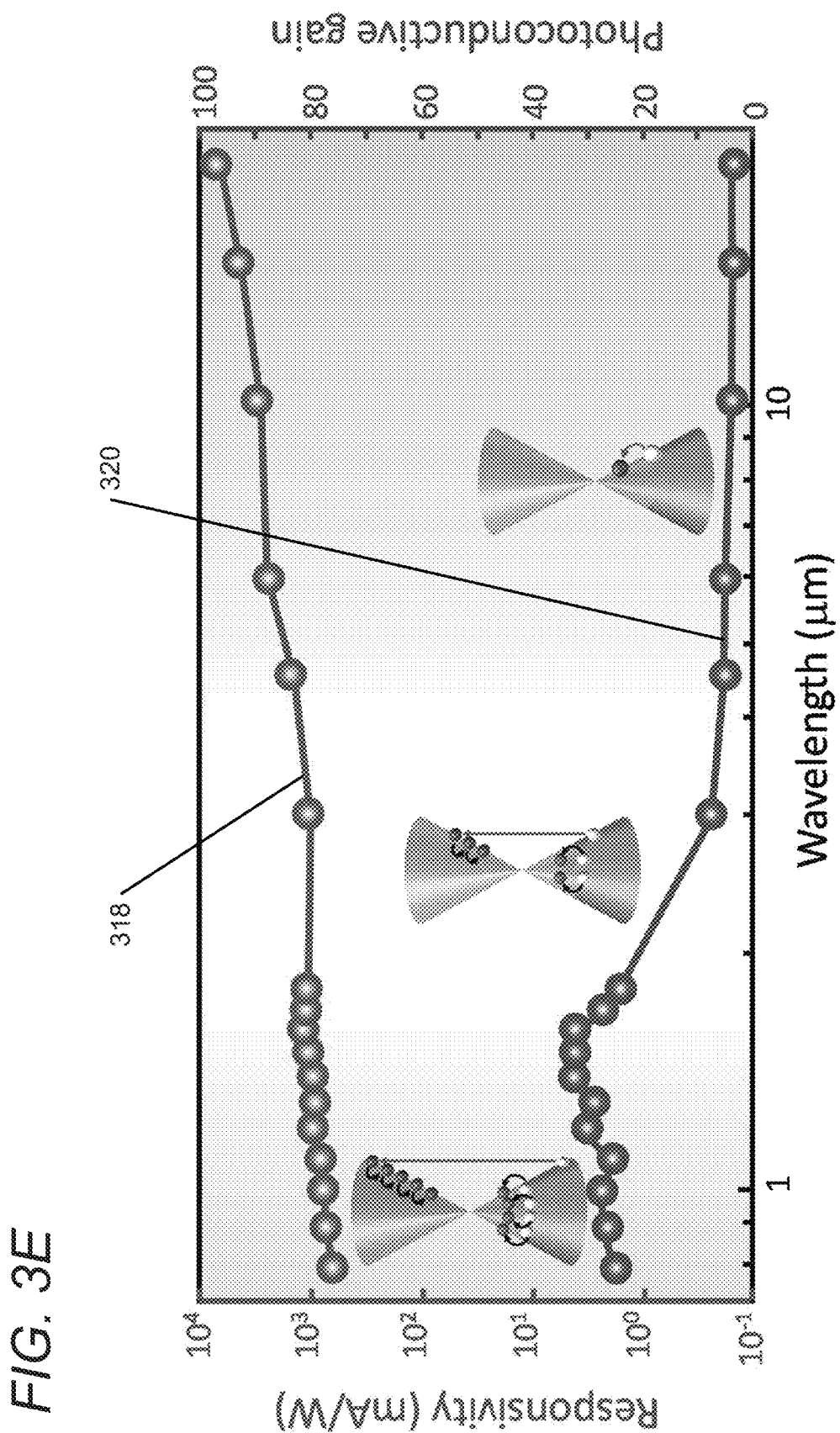
FIG. 3E shows a graph illustrating the measured responsivity of a metallo-graphene nanocomposite photodetector at an optical power of 2.5 μW, gate voltage of 20 V, and bias voltage of 20 mV in accordance with an embodiment of the invention.

FIG. 3E shows a graph illustrating the measured responsivity (top data points 318) of a fabricated metallo-graphene nanocomposite photodetector at an optical power of 2.5 µW, gate voltage of 20 V, and bias voltage of 20 mV. The photodetector offers an ultrabroad operation bandwidth from the visible to the infrared regime with high-responsivity levels ranging from 0.6 A/W (at an 800 nm wavelength) to 8 A/W (at a 20 µm wavelength). In some embodiments, by optimizing the bias and gate voltages, even higher responsivity levels can be achieved. The photoconductive gain of the fabricated photodetector is calculated from the measured responsivity and the estimated optical absorption in graphene, as illustrated in FIG. 3E (bottom data points 320). As shown, higher photoconductive gains are achieved at lower wavelengths, at which the photogenerated electrons are excited to higher energy levels in the conduction band. Excitation to higher energy levels increases carrier scattering and the number of generated secondary electron-hole pairs, as illustrated in the inset of FIG. 3E. Although a specific photodetector structure and measurements are described above with reference to FIGS. 3A-3E, any of a variety of photodetector structures implementing different geometries and configurations can be utilized as appropriate to the requirements of specific applications in accordance with various embodiments of the invention. For example, the geometries of plasmonic nanoantennas in photodetectors in accordance with various embodiments are not limited only to those shown in FIGS. 3A and 3B. Varying sizes, shapes, distributions can be implemented depending on the specific requirements of a given application. Furthermore, although photodetector embodiments are discussed, the fundamental operation principles of such photodetectors as discussed are applicable to a wide variety of optoelectronic applications, including (but not limited to) those mentioned throughout this disclosure.

Heat Harvesting Devices Incorporating Metallo-Graphene Nanocomposites

Metallic nanostructures such as those described above can be used in a variety of applications. Many embodiments of the invention are directed toward energy conversion devices that incorporate nanostructures that can be used in a variety of environments, including scalable and green data centers. Heat generation and dissipation are problems that bottleneck many industries. All electronic devices and circuitry can generate excess heat. In high performance devices, the excess heat can raise the temperatures of the systems to excessively high levels. For example, data centers consume huge amounts of electrical energy, most of which is converted to heat. This heat dissipation typically requires cooling of the data centers to prevent damage to the equipment. However, common techniques for cooling, such as water cooling or mechanical cooling, are not efficient for heat energy recovery because of the temperature levels of the produced heated water and air. Although there exist waste heat recovery techniques such as thermoelectric generators, thermionic generators, adsorption chillers, and heat pumps, these technologies are employed in limited settings and are typically unable to convert waste heat to a useable form of energy at a large scale.

In many embodiments, a metallo-graphene nanocomposite is packaged and implemented as a heat harvesting device that can convert certain wavelengths of electromagnetic radiation into an electrical current. Dissipated thermal energy from various objects is typically dominated by the blackbody radiation of the objects (i.e. the thermal electromagnetic radiation emitted by the objects). Unlike the Sun's blackbody radiation, the blackbody radiation of the objects around us is mostly concentrated in the infrared regime due to their relatively low temperatures. For example, computer and server systems are usually kept at temperatures between 15° C. and 35° C. More than 95% of the blackbody radiation from computer and server systems is at wavelengths ranging from 1 μm to 40 μm. However, the efficient conversion of photons within this broad infrared wavelength range to charge carriers has been limited by the bandgap energy of conventional semiconductor compounds. The use of graphene has been explored as a potential candidate to resolve this issue since the unique gapless band structure of graphene can allow the conversion of photons to electron-hole pairs over an extremely broad spectral range from the ultraviolet to the microwave regime. However, the short carrier lifetime of graphene can make it difficult to recycle the generated electron-hole pairs efficiently. Many embodiments of the present invention seek to resolve this problem by incorporating metallic nanostructures into a graphene layer to form a heat harvesting device that enables the conversion of infrared radiation to electrical current over most, if not all, of the infrared range.

Further to the example above, data centers that contain high volumes of computer and server systems can have high levels of electrical usage, a majority of which is typically unused by the systems and converted to heat. In many embodiments, heat harvesting devices incorporating metallo-graphene nanocomposites can be utilized to convert up to 80% of the thermal waste energy of data centers to electrical energy. The generated current can be injected to the power grid or stored in a battery to be reused in the data center. Therefore, the use of the proposed heat harvesting device can significantly reduce the energy demand of data centers and can offer a scalable, economical, and green platform for future data centers. Furthermore, heat harvesting devices in accordance with many embodiments of the invention can be implemented through a low-cost and high-throughput fabrication process due to its compatibility with silicon-based fabrication platforms.

In many embodiments, heat harvesting/conversion devices are designed to operate with a large active area. In some embodiments, the heat harvesting device is implemented in a sheet configuration. For some applications, the heat harvesting device can be designed to have a large surface area component for transferring heat from the environment and into the device. The device can be designed and constructed to have high electromagnetic radiation emissivity to the interior structure where the energy is converted (i.e. the metallo-graphene nanocomposites) but not to the exterior environment and/or material in order to maximize efficiency. In other words, the heat harvesting device can be designed to facilitate the transfer of heat from the environment into the cell while attempting to limit the reverse process as much as possible in order to increase efficiency. This can be accomplished in many ways, including (but not limited to) increasing the surface area of the material on the interior side, effectively creating a heat sink that can favor the emission of IR electromagnetic radiation to the interior structure.

Figure 4A:
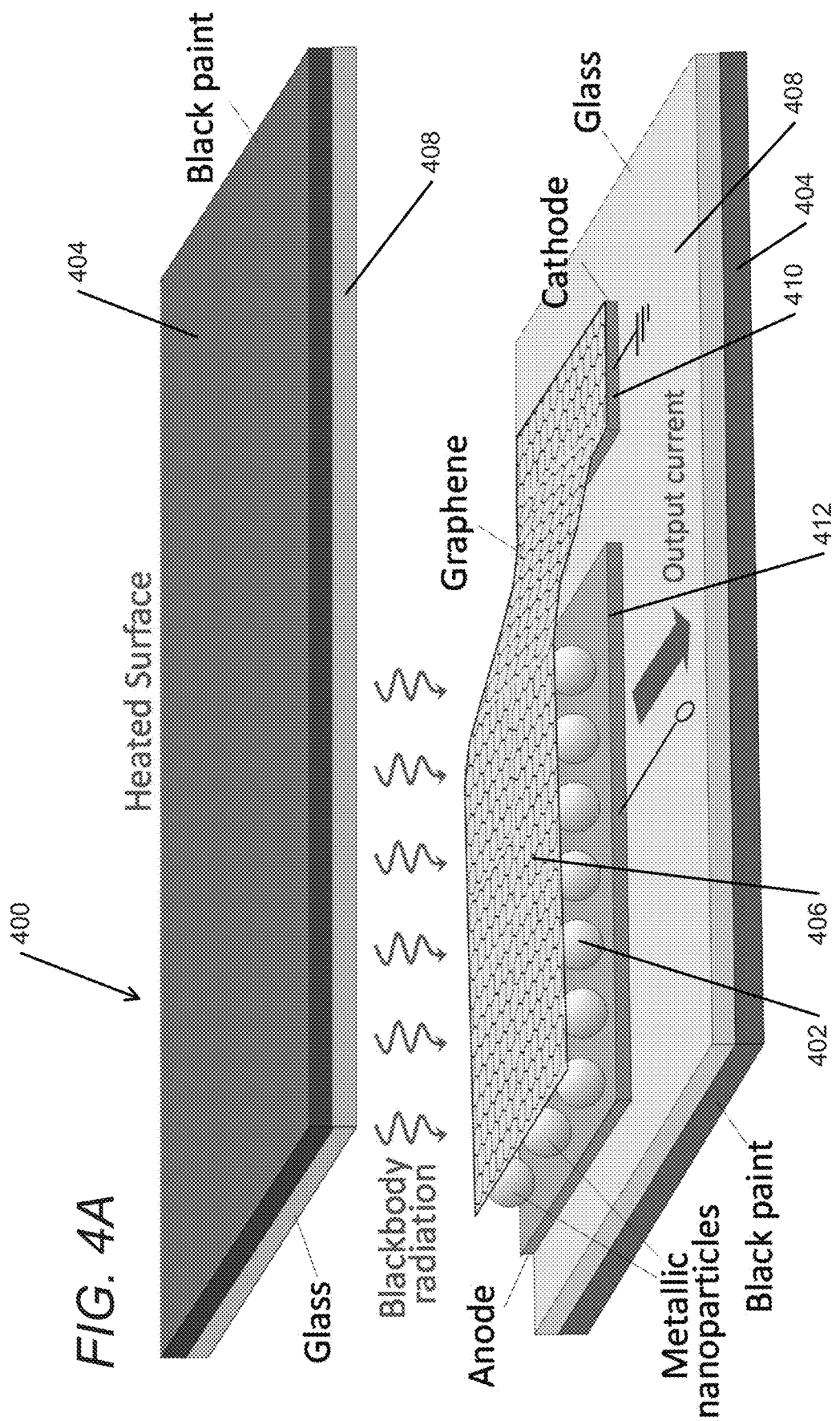
FIG. 4A conceptually illustrates a heat harvesting device incorporating metallo-graphene nanocomposites that can convert blackbody emitted IR radiation to electric current in accordance with an embodiment of the invention.

Operation principles of a heat harvesting device incorporating metallo-graphene nanocomposites in accordance with an embodiment of the invention is shown in FIG. 4A. Dissipated heat from objects can be absorbed by a heat absorber. A heat harvesting device 400 incorporating metallic nanoparticles 402 can be implemented such that generated blackbody radiation from a heat absorber 404 is incident on a graphene sheet 406. In the illustrative embodiment, black paint is utilized as a heat absorber 404. The heat absorber 404 can be coated with a high emissivity dielectric 408, such as (but not limited to) glass, to maximize the generated blackbody radiation. As shown in the illustrated schematic, one side of the graphene sheet 406 is in direct contact with a cathode electrode 410 and the other side of the graphene sheet 406 is in direct contact with a 2D array of metallic nanoparticles 404 placed on top of an anode electrode 412.

Although FIG. 4A illustrates a specific embodiment of a heat harvesting device, there are many possible configurations of heat harvesting devices that can be implemented in accordance with various embodiments of the invention. For example, the heat absorber/dielectric components can vary widely in the type of material used and can be replaced altogether. In many embodiments, criteria for such components can include the ability to absorb heat, whether through electromagnetic radiation or conduction, and to produce blackbody radiation toward the photo-absorbing material, such as (but not limited to) a graphene sheet, of the heat harvesting device.

Figure 4B:
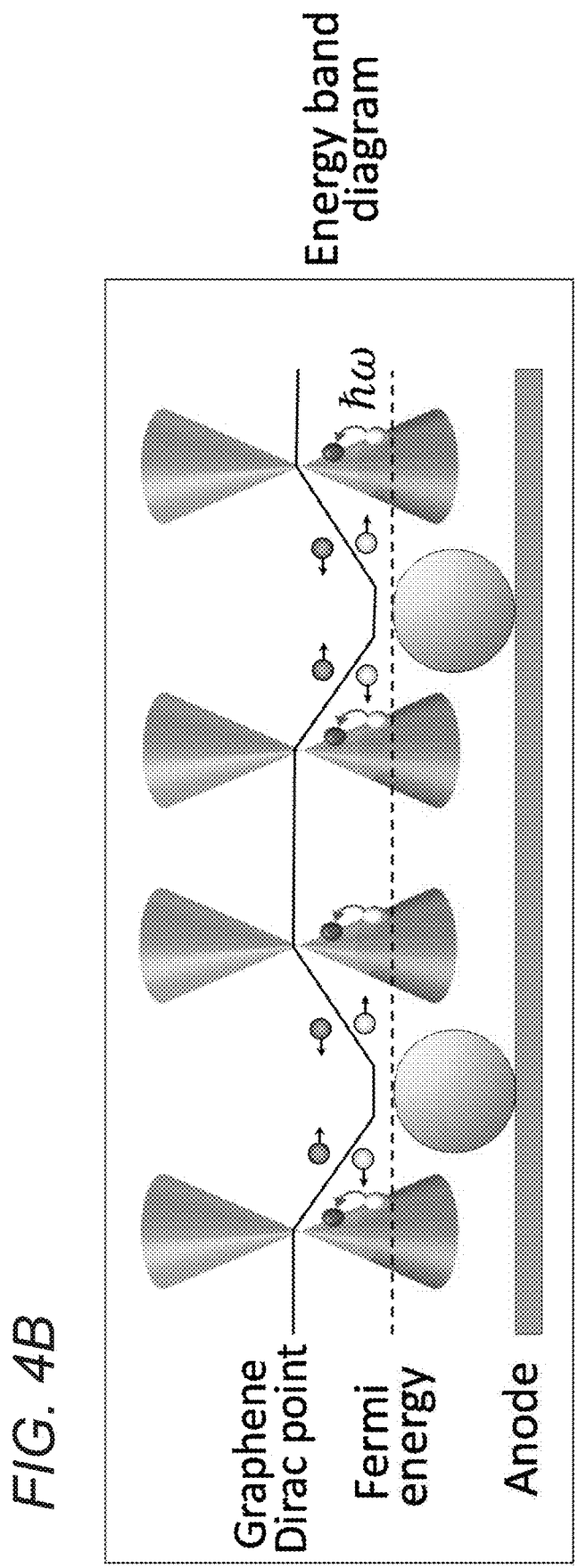
FIG. 4B is an energy band diagram for a heat harvesting device incorporating metallo-graphene nanocomposites in accordance with an embodiment of the invention.

Heat harvesting devices can be fabricated in high volumes and large areas. In many embodiments, the graphene is first patterned and then the metallic nanostructures are formed on top. Graphene and metallic nanostructures can be patterned/placed using many different techniques such as (but not limited to) self-assembly techniques, transfer techniques deposition and lift-off techniques, imprint and/or nanoimprint lithography, and other lithographic techniques. The anode and cathode electrodes can be placed on a glass substrate coated with a heat absorber to confine the blackbody radiation near the graphene sheet. When the blackbody radiation is absorbed by the graphene, electron-hole pairs can be generated inside the graphene. As illustrated in the device energy band diagram of FIG. 4B, the doping level of the graphene sheet can determine the Fermi energy level of graphene between the metallic nanoparticles, but the metal-induced doping level sets a different Fermi energy level at the metallic nanoparticle junctions. This can result in a band-bending near the metallic nanoparticles. By carefully adjusting the doping level of the graphene sheet and the geometry of the nanoparticles, the band-bending slope can be adjusted to maximize the number of the electrons drifting within the graphene to the metallic nanoparticles while repelling the holes away from the metallic nanoparticles. Consequently, the electrons drifting to the metallic nanoparticles can be routed to the anode electrode and the repelled holes can be recombined inside the graphene. In order to achieve high heat harvesting efficiencies, the geometry of the metallic nanoparticles can be chosen to maximize blackbody radiation concentration in the graphene near the metallic nanoparticles, where the maximum band-bending occurs.

In many embodiments, heat harvesting devices can be designed to convert heat from other sources beside electromagnetic radiation into an electric current. For example, in some embodiments, the metallo-graphene nanocomposites are implemented in devices used for direct heat harvesting (i.e. generating an electric signal when heated) without the involvement or in addition to carrier generation due to blackbody radiation. When the device is heated is such a way, hot carriers in the graphene material can diffuse from regions with lower density of states to regions with higher density of states to maximize the entropy. Due to the band-bending near the metal-graphene junctions (as described above), the density of states at the metal-graphene junctions is different from the density of the states in the graphene. As a result, the induced hot electrons can flow from the graphene to the metal junctions or from the metal junctions to the graphene depending on the band bending slope at the junction.

Asymmetric Nano-Grating Contact Electrodes

As discussed above, instead of placing a symmetric pattern of nanostructures, asymmetric metal patches can be implemented, which can break the symmetry of the electrical potential inside the graphene nanoribbons and allow bias-free, low-dark-current device operation. The asymmetric geometry of gold-patched graphene nanoribbons can lead to a highly polarization-sensitive responsivity, which can have many applications in polarimetric imaging and sensing systems. In many embodiments, metallo-graphene nanocomposite can utilize nano-grating contact electrodes to offer high responsivity and sensitivity levels through a bias-free device platform. The nano-grating contacts can be designed to enhance optical absorption in the graphene photo-absorbing layer. The contacts can also be designed such that a large fraction of the photogenerated carriers are generated in close proximity to the nano-gratings to be efficiently extracted before recombination inside the graphene. The distance between the adjacent grating metals can be chosen to be shorter than the transition region at the metal-graphene junction to introduce a band-bending in graphene, which allows efficient extraction of the photogenerated carriers without any need for an external bias voltage. High power-efficiency and sensitivity levels can be achieved by the presented bias-free graphene photodetector due to a significant reduction in the device dark current and noise current levels. In some embodiments, photodetection with responsivity levels as high as 225 mA/W and noise equivalent power levels as low as 7 $\mu W/Hz^{1/2}$ at 800 nm can be achieved through use of a bias-free graphene photodetector with nano-grating contact electrodes in accordance with certain embodiments of the invention.

Figure 5A:
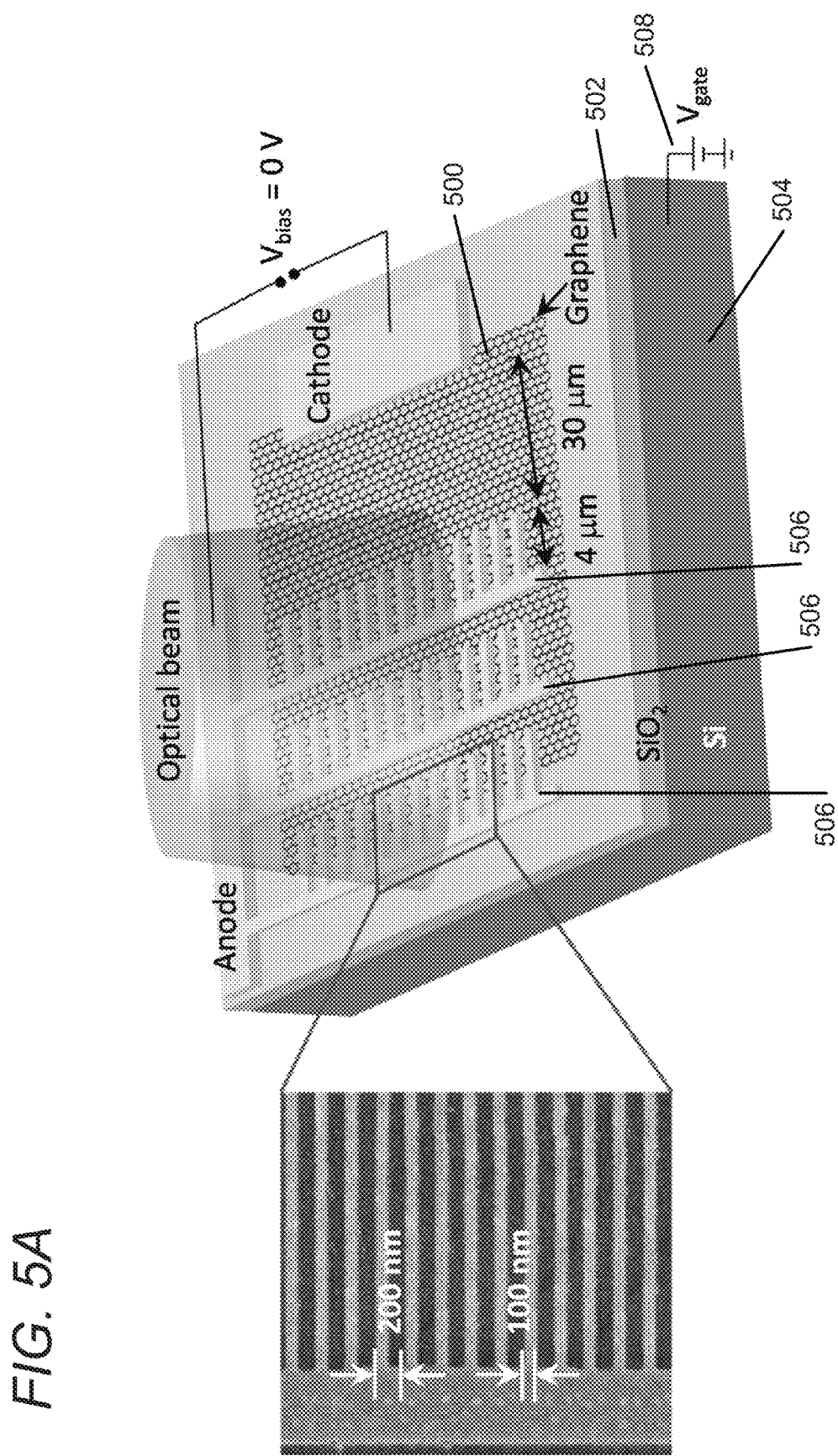
FIG. 5A conceptually illustrates a bias-free metallo-graphene nanocomposite and the scanning electron microscope image of a fabricated nano-grating in accordance with an embodiment of the invention.

A schematic diagram of a metallo-graphene nanocomposite and the scanning electron microscope image of a fabricated nano-grating in accordance with an embodiment of the invention is conceptually illustrated in FIG. 5A. As shown, a single graphene layer 500 serving as the photo-absorbing material is transferred onto a $SiO_2$ film 502, which is thermally grown on a high-resistivity Si substrate 504. In the illustrative embodiment, arrays of Ti/Au nano-gratings 506 covering a 30×30 $\mu m^2$ area serve as the anode contact electrode (i.e. the contact electrode extracting the photogenerated electrons). The graphene Fermi energy level can be controlled by a gate voltage 608, $V_{gate}$, applied to the silicon substrate 504. The carrier concentration and sheet resistance of the graphene layer used in the illustrative embodiment were measured to be $1.8 \times 10^{13}$ $cm^{-2}$ and 804Ω/□ when no gate voltage is applied. The optical beam is incident on the nano-grating arrays and the induced photocurrent flows between the anode and cathode contacts under a zero bias voltage, as illustrated in FIG. 5A.

Figure 5B:
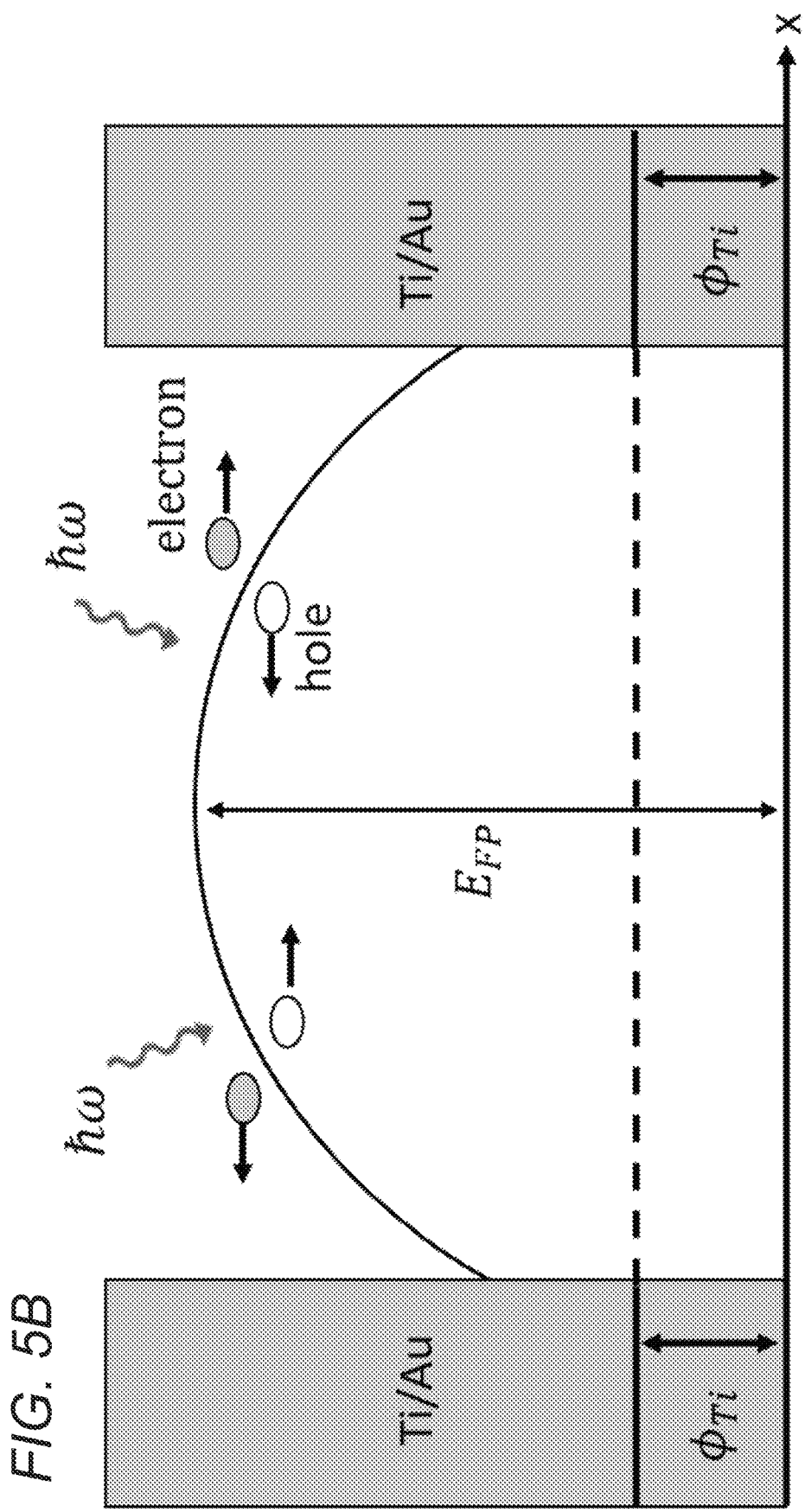
FIG. 5B conceptually illustrates the band diagram of a metallo-graphene nanocomposite between two adjacent grating metals at a fixed gate voltage in accordance with an embodiment of the invention.

The metallic nano-grating geometry can be selected to efficiently couple the incident optical beam to the graphene layer and the distance between the two adjacent grating metals can be designed short enough so that most of the photogenerated carriers reach the grating metals before recombining inside the graphene. In the illustrative embodiment, the grating geometry includes a 200 nm periodicity, 100 nm metal width, and 50 nm metal thickness. The metallic nano-grating geometry can also be chosen to introduce a band-bending in graphene to allow efficient extraction of the photogenerated carriers without any need for an external bias voltage. FIG. 5B conceptually illustrates the band diagram of a metallo-graphene nanocomposite between two adjacent grating metals at a fixed gate voltage in accordance with an embodiment of the invention. The Fermi energy level of graphene at the metal contacts ($\phi Ti=100$ meV) can be determined by the graphene doping induced by absorption on the contact surface. The peak Fermi energy level of graphene ("EFP") in the middle of the metal contacts can be determined by the graphene doping induced by the applied gate voltage. This configuration introduces a band-bending in graphene that can be controlled by the choice of metal and gate voltage. As a result, the photogenerated holes can move away from the grating metals and eventually recombine in graphene. However, the photogenerated electrons can move to the grating metals where they are extracted, inducing a photocurrent at a zero bias voltage.

Figure 5C:
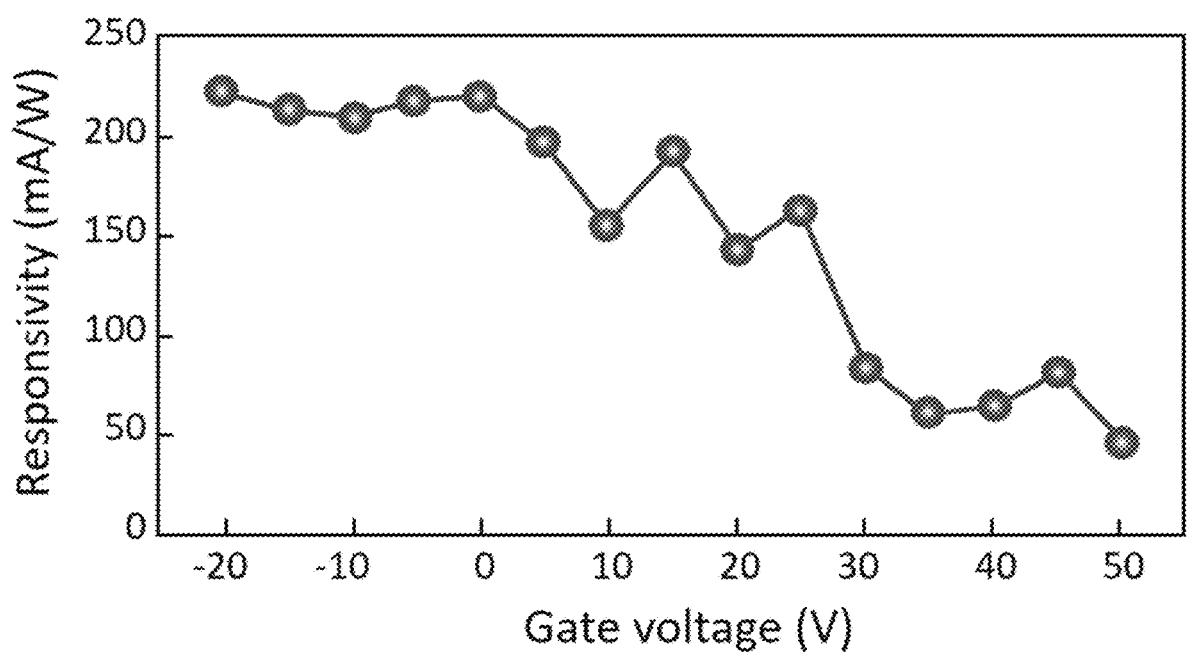
FIG. 5C shows a graph illustrating the responsivity of a fabricated metallo-graphene nanocomposite measured as a function of gate voltage at an incident optical power of 2.5 μW in accordance with an embodiment of the invention.

FIG. 5C shows a graph illustrating the responsivity of a fabricated metallo-graphene nanocomposite measured as a function of gate voltage at an incident optical power of 2.5 $\mu W$ in accordance with an embodiment of the invention. In the illustrative embodiment, the gate voltage varied from −20 V to 50 V and a zero bias voltage was applied between the anode and cathode contacts. Measurement results show that higher responsivity levels can be achieved at lower gate voltages. This increase in responsivity can result from an increase in the p-type doping level of graphene at lower gate voltages, which leads to a higher graphene Fermi energy level, a steeper band-bending, and a stronger induced field drifting the photogenerated electrons to the grating metals. As shown, responsivity levels as high as 225 mA/W were achieved at a −20 V gate voltage, exhibiting an order of magnitude enhancement in responsivity compared to the conventional bias-free graphene photodetectors. The responsivity decreases at higher optical powers due to the increase in the carrier recombination rate at high photogenerated carrier densities.

Figure 5D:
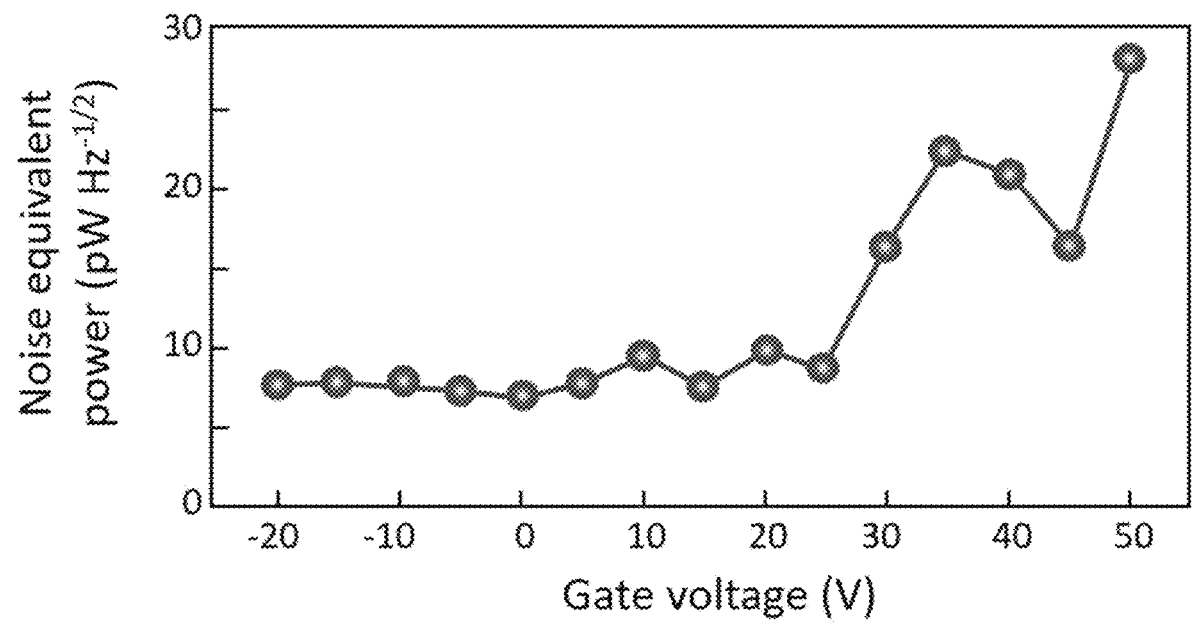
FIG. 5D shows a graph illustrating the noise equivalent power of a fabricated metallo-graphene nanocomposite prototype as a function of gate voltage in accordance with an embodiment of the invention.

FIG. 5D shows a graph illustrating the noise equivalent power of a fabricated metallo-graphene nanocomposite prototype as a function of gate voltage in accordance with an embodiment of the invention. The noise equivalent power of the fabricated photodetector was estimated by calculating the photodetector noise current, which is dominated by the Johnson Nyquist noise due to the negligible dark current of the photodetector. As shown, the calculated noise equivalent power levels from the extracted noise current and measured responsivity values were as low as 7 $\mu W/Hz^{1/2}$, exhibiting a high-sensitivity photo-detection operation.

Fabrication Methods for Nanocomposites

Photodetectors, energy conversion devices, and other structures utilizing gold-patched graphene nanoribbons to convert incident electromagnetic radiation to electric currents in accordance with several embodiments of the invention can be fabricated using a variety of methods. In many embodiments, nanoimprinting lithographic techniques are utilized to fabricate the nanostructure patterns. Depending on the materials used, self-assembly techniques can be utilized. In some embodiments, commercially available chemical vapor deposition ("CVD")-grown graphene is first transferred to a high-resistivity silicon wafer covered with a thermally grown $SiO_2$ layer. In a variety of embodiments, the $SiO_2$ layer is thermally grown with a targeted 130 nm-thickness. In a number of embodiments, the gold patches are patterned by electron beam lithography and formed by deposition and liftoff. In further embodiments, the gold patches are patterned by electron beam lithography and formed by 5/45 nm Ti/Au deposition and liftoff.

In liftoff fabrication, a positive pattern is formed using an additive technique that involves a sacrificial layer, typically made of photoresist, containing an inverse pattern of the targeted pattern. The photoresist sacrificial layer can be formed with a negative pattern on top of a substrate, typically a silicon wafer. As can readily be appreciated by a person having ordinary skill in the art, a variety of substrates, such as (but not limited to) GaAs, InAs, and other semiconductor materials, can be used as appropriate to the requirements of specific applications in accordance with various embodiments of the invention. The targeted material can then be deposited over the entire area, including inside the negative pattern. Once the sacrificial layer is removed, typically using a specific solvent, a positive pattern of the sacrificial layer's inverse pattern remains.

Graphene nanoribbons can be patterned by another electron beam lithography step and formed by oxygen plasma etching. Next, the bias lines and output pads can be formed by optical lithography and formed by 20/200 nm Ti/Au deposition and liftoff. Finally, the gate pads can be patterned by optical lithography and formed by $SiO_2$ plasma etching, followed by 20/200 nm Ti/Au deposition and liftoff. Although the methods described above are directed to fabrication methods with targeted material heights, a person having ordinary skill in the art would understand that the heights can vary as appropriate to the requirements of specific applications in accordance with various embodiments of the invention Measurements of Performance Metrics of Metallo-Graphene Nanocomposites A supercontinuum laser and a stabilized Globar light source combined with infrared bandpass filters can be used to characterize photodetector responsivity in the near-infrared and infrared regimes, respectively. A supercontinuum laser can be used to measure the photodetector responsivity in the visible/near-infrared regime (around the 0.8-1.8 μm wavelength range). The fiber-coupled output of the supercontinuum laser can be placed very close to the device to ensure that all output power is incident on the device active area. The responsivity values can be calculated from the measured photocurrent using a source measure unit instrument and the measured optical power using a calibrated near-infrared photodetector. A Globar light source combined with different infrared bandpass filters can be used to measure the photodetector responsivity in the infrared range (around the 3-20 μm wavelength range). A calibrated calorimeter can be used to measure the infrared radiation at each wavelength. The calorimeter can be positioned from the Globar output where the infrared intensity is uniform across the calorimeter input aperture. The uniformity of the infrared beam can be confirmed by replacing the calorimeter with a metallo-graphene nanocomposite photodetector and monitoring its output photocurrent while moving it in the plane normal to the incident beam. The responsivity values can be calculated from the measured photocurrent and the measured infrared power using the calorimeter and scaled by the ratio between the active area of the metallo-graphene nanocomposite photodetector and the calorimeter.

Figure 6A:
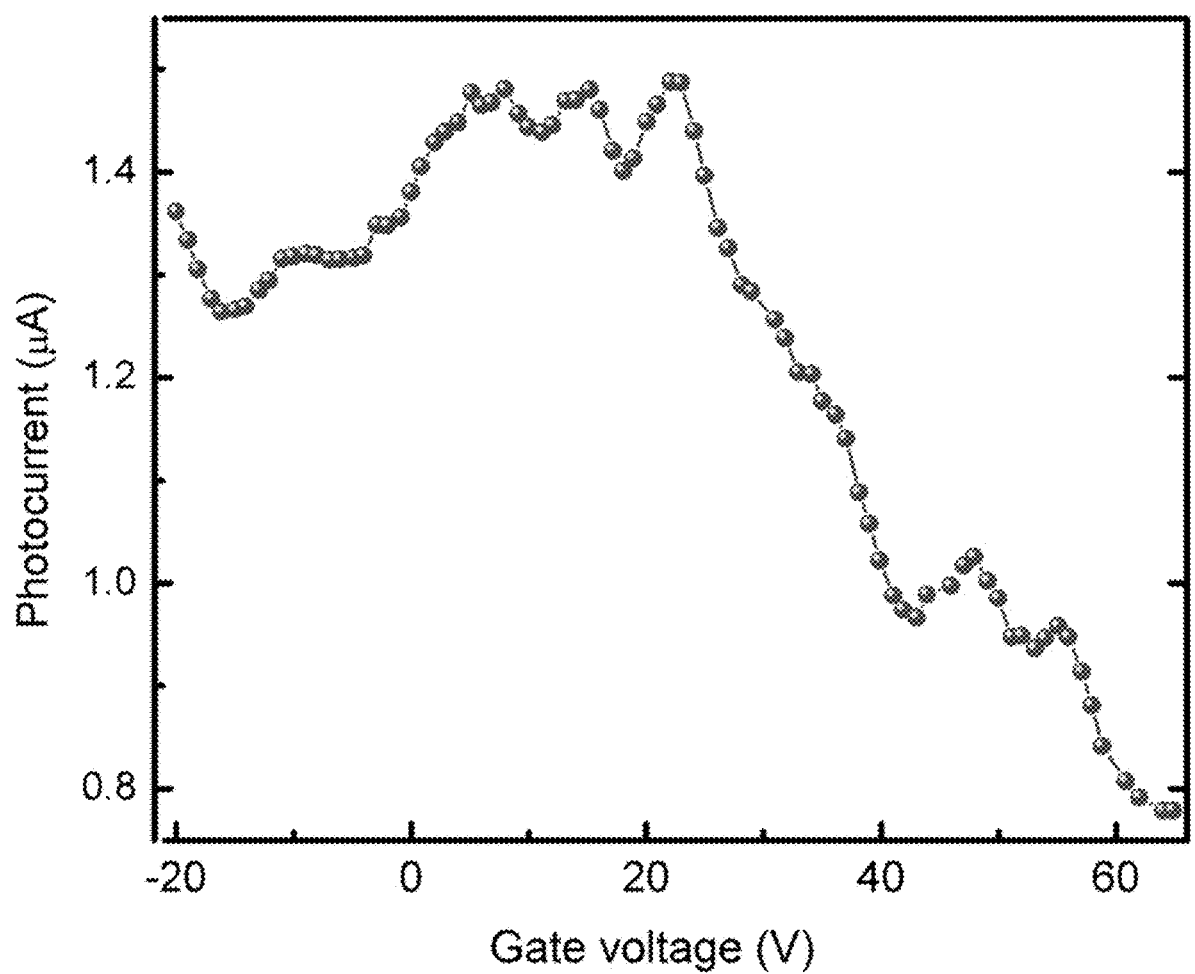
FIG. 6A shows a graph illustrating the measured photocurrent as a function of the gate voltage at an optical power of 2.5 μW of a metallo-graphene nanocomposite photodetector in accordance with an embodiment of the invention.

FIG. 6A shows a graph illustrating the measured photocurrent as a function of the gate voltage at an optical power of 2.5 μW of a metallo-graphene nanocomposite photodetector in accordance with an embodiment of the invention. For this measurement, a constant voltage of 20 mV was applied between the source and drain contacts and the gate voltage was swept from −20 V to 65 V. In the illustrative photodetector, the highest photocurrent level was achieved at a gate voltage of 22 V. One reason for such measurements can result from the graphene band-bending on the drain side becoming much more pronounced than that of the source side at 22V, maximizing the device responsivity. The photodetector responsivity, defined as the ratio between the induced photocurrent and the optical power level, was measured to be 0.6 A/W at the gate voltage of 22 V.

Figure 6B:
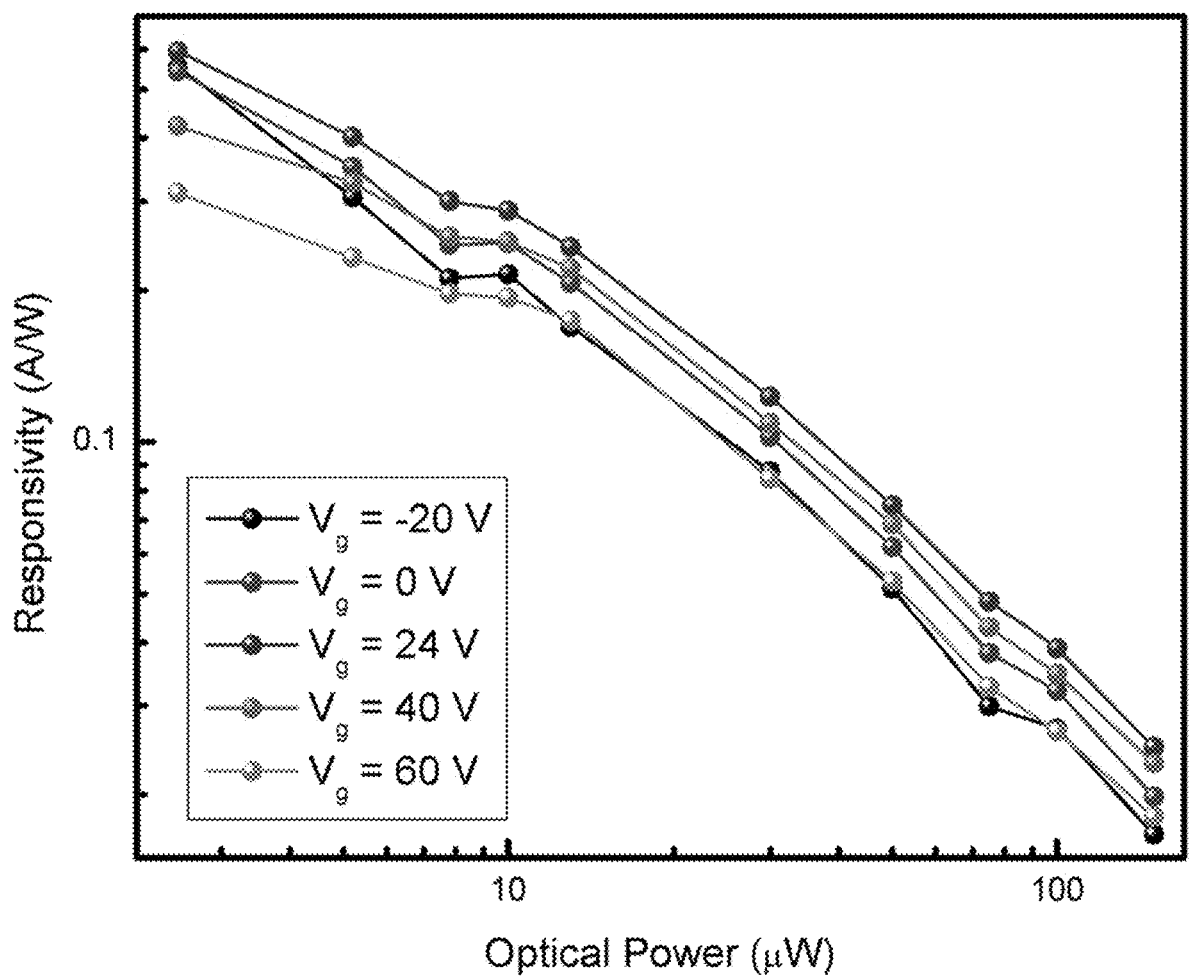
FIG. 6B shows a graph illustrating the measured responsivity as a function of the optical power of a metallo-graphene nanocomposite photodetector in accordance with an embodiment of the invention.

FIG. 6B shows a graph illustrating the measured responsivity as a function of the optical power of a metallo-graphene nanocomposite photodetector in accordance with an embodiment of the invention. Although FIG. 6A illustrates that the highest responsivity levels were typically achieved at the gate voltage of ~22 V for the illustrative photodetector, FIG. 6B shows that the responsivity levels drop at higher optical power levels. One possible explanation is due to a limited number of available states in graphene that can be filled with photo-generated carriers, saturating the output photocurrent at high optical powers. Another mechanism responsible for responsivity drop at high optical powers can include an increase in the carrier recombination rate at high photo-generated carrier densities, which can reduce the carrier scattering time and the carrier multiplication efficiency in graphene.

Figure 6C:
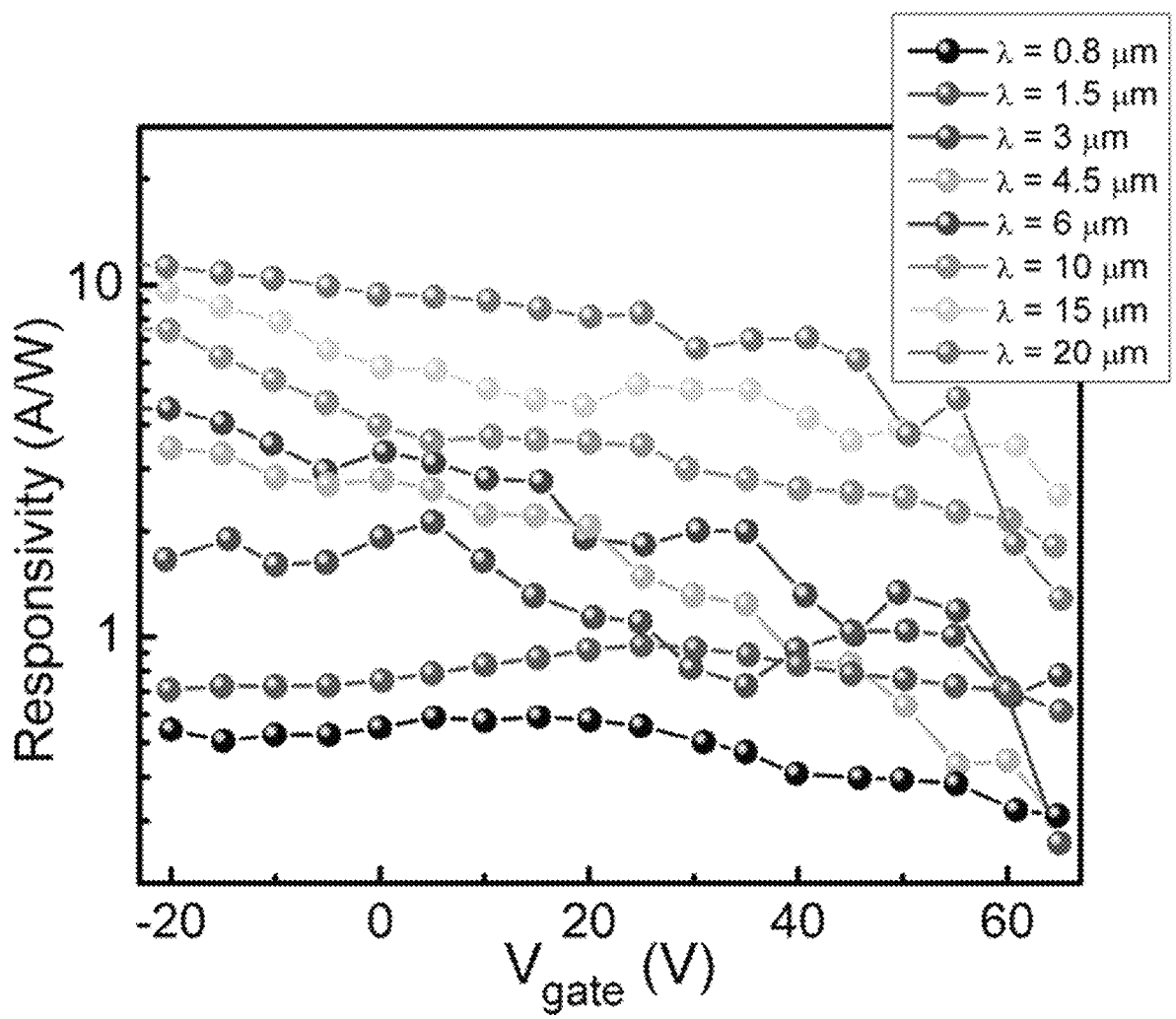
FIG. 6C shows a graph illustrating the measured responsivity as a function of the gate voltage at various wavelengths ranging from 800 nm to 20 μm of a graphene photodetector in accordance with an embodiment of the invention.

FIG. 6C shows a graph illustrating the measured responsivity levels as a function of the gate voltage at various wavelengths ranging from 800 nm to 20 μm, showing the broad operation bandwidth of a metallo-graphene nanocomposite photodetector in accordance with an embodiment of the invention. The photodetector responsivity can be defined as the ratio between the induced photocurrent and the optical power level. In the illustrative embodiment, a constant voltage of $VDS=20$ mV is applied, and the gate voltage is swept from −20 V to 65 V. Interband optical transitions can determine the optical response of the metallo-graphene nanocomposite photodetector in the near infrared regime. In a number of embodiments, the graphene band-bending on the drain side becomes much more pronounced than that of the source side at 24 V for the measurements at 800 nm and 1.55 μm wavelengths, which can result in a peak in responsivity levels at 24 V. On the other hand, optical response of graphene in the mid-infrared and far-infrared regimes can be mainly dominated by intraband transitions. Therefore, optical absorption of the graphene sheet can be strongly controlled by changing its doping level at these wavelengths through the applied gate voltage. Typically, optical absorption of graphene increases as its doping level increases. As a result, the photocurrent levels can continue to increase as the Fermi energy level is pushed away from the Dirac point, as illustrated in FIG. 6C.

Photodetectors can have varying performance metrics that can depend on many aspects. Three factors have been examined for their effects on the speed of photodetectors in accordance with various embodiment of the invention: carrier lifetime, carrier transit time, and the RC time constant of the device. In many embodiments, a 3 dB bandwidth of 425 GHz for detected optical power through a fabricated graphene photodetector was shown. In some embodiments, operation speeds exceeding 500 GHz for fabricated graphene photodetectors have been shown. In some instances, operation speeds can be limited by the RC time constant of the device. FIG. 6D shows a graph of predicted and measured responsivity values as a function of optical beating/modulation frequency of a metallo-graphene nanocomposite photodetector in accordance with an embodiment of the invention. Operation speed of fabricated metallo-graphene nanocomposite photodetectors can be characterized by use of two fiber-coupled, wavelength-tunable, distributed-feedback ("DFB") lasers with 783 nm and 785 nm center wavelengths. In the experimental setup of FIG. 6D, both lasers have a spectral linewidth of 2 MHz and a wavelength tunability range of 2.4 nm. When the two laser beams are combined in a single fiber, they can provide a tunable optical beating frequency, which can range from 20 MHz to 2 THz in some instances. The combined laser beams can be used to illuminate the fabricated metallo-graphene nanocomposite photodetector. A small portion of the optical beam can be monitored through an optical spectrum analyzer to ensure the two beating optical beams are maintained at the same power levels. The photodetector output is probed by a ground-signal-ground ("GSG") microwave probe and monitored on a spectrum analyzer. The frequency limitations of the utilized GSG probe and spectrum analyzer allowed for high-frequency measurements of up to 50 GHz with no roll-off in responsivity, as shown in FIG. 6D.

Figure 7B:
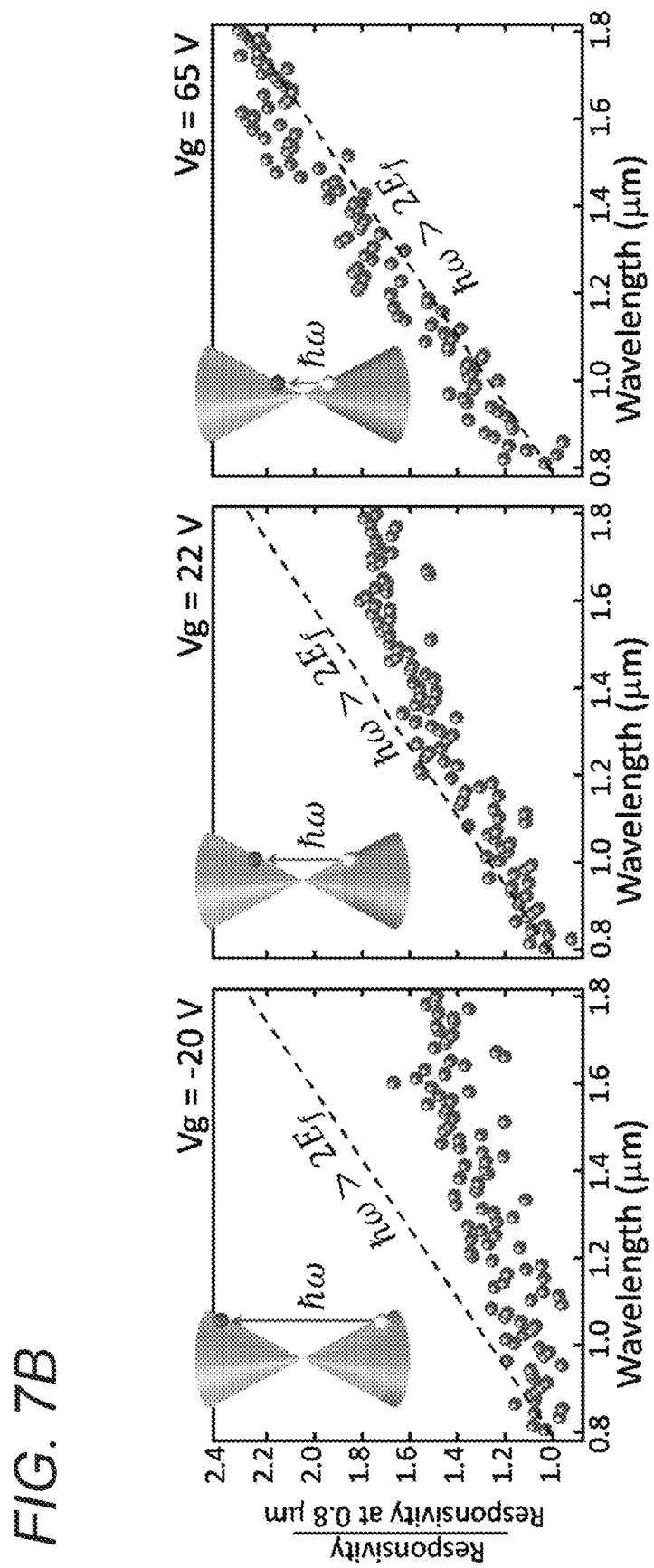
FIG. 7B shows three graphs illustrating how the gate voltage affects the photodetector responsivity by varying the optical absorption of graphene in accordance with an embodiment of the invention.

FIGS. 7A and 7B show the effects of the gate voltage on the responsivity of a photodetector in accordance with an embodiment of the invention in the visible and near-infrared regimes, where the optical absorption is dominated by interband transitions in the graphene. The effect of the gate voltage can be described by the device band diagrams at various gate voltages 700, 702, and 704, which illustrate that the gate voltage can tune the carrier concentration and Fermi energy level of the graphene nanoribbons between the gold patches while maintaining the same metal-induced doping levels at the gold-patch junctions. This tuning can modify the band-bending slope at the gold-patch junctions. The induced photocurrent can be proportional to the difference of the band-bending slopes at the anode and cathode junctions. The inset figures show the band diagram of the metallo-graphene nanocomposite photodetector at gate voltages of −20 V, 22 V, and 65 V. The Fermi energy level ($E_F$) and the graphene Dirac point energy level ($E_F'$) are illustrated by the dashed and solid black lines, respectively. The carrier concentration of the graphene nanoribbons used in this study is measured to be $7.2 \times 10^{12}$ cm$^{-2}$ when the gate is unbiased, indicating highly p-doped graphene nanoribbons at a gate voltage of −20 V.

FIG. 7A shows a graph illustrating the responsivity of a fabricated metallo-graphene nanocomposite photodetector at a wavelength of 800 nm when the gate voltage is varied between −20 V and 65 V in accordance with an embodiment of the invention. As the gate voltage decreases from 65 V, the p-type carrier concentration in the graphene nanoribbons increases and a steeper energy band-bending is introduced on the anode side than the cathode side. The variations in the band-bending slopes can lead to an increase in the induced photocurrent when decreasing the gate voltage. In the illustrated embodiment, this trend changes at the gate voltages less than 22 V and a decrease in the induced photocurrent is observed when decreasing the gate voltage further. The observed decrease in photocurrent at the gate voltages less than 22 V can be explained by the reduction of carrier mobility at high carrier densities because of the increase in carrier scattering. In the illustrated embodiment, the highest responsivity level is achieved at a gate voltage of 22 V. Because carrier multiplication is an important factor that contributes to the high photoconductive gain of the photodetector in the visible and near-infrared regimes, the photodetector responsivity can decrease at higher optical powers. This decrease can be explained due to the increase in the carrier recombination rate at high photogenerated carrier densities, which reduces the carrier scattering time and the carrier multiplication efficiency.

FIG. 7B shows three graphs illustrating how the gate voltage affects the photodetector responsivity by varying the optical absorption of graphene in accordance with an embodiment of the invention. The measured responsivity values in the visible and near-infrared regimes ranging from 800 nm to 1.8 µm at gate voltages of −20 V, 22 V, and 65 V are shown. The responsivity values at each gate voltage are divided by the photodetector responsivity at 800 nm to eliminate the influence of variations in the band diagram at different gate voltages. The dashed lines show the predicted responsivity spectra if interband transitions are allowed over the entire wavelength range. A linear relationship between the responsivity and optical wavelength is predicted if interband transitions are allowed over the entire wavelength range. However, because interband optical transitions are allowed when $\hbar w \geq 2E_f$, the photodetector responsivity is substantially reduced at lower photon energies when the gate voltage is lowered from 65 V to 22 V and −20 V.

Figure 8A:
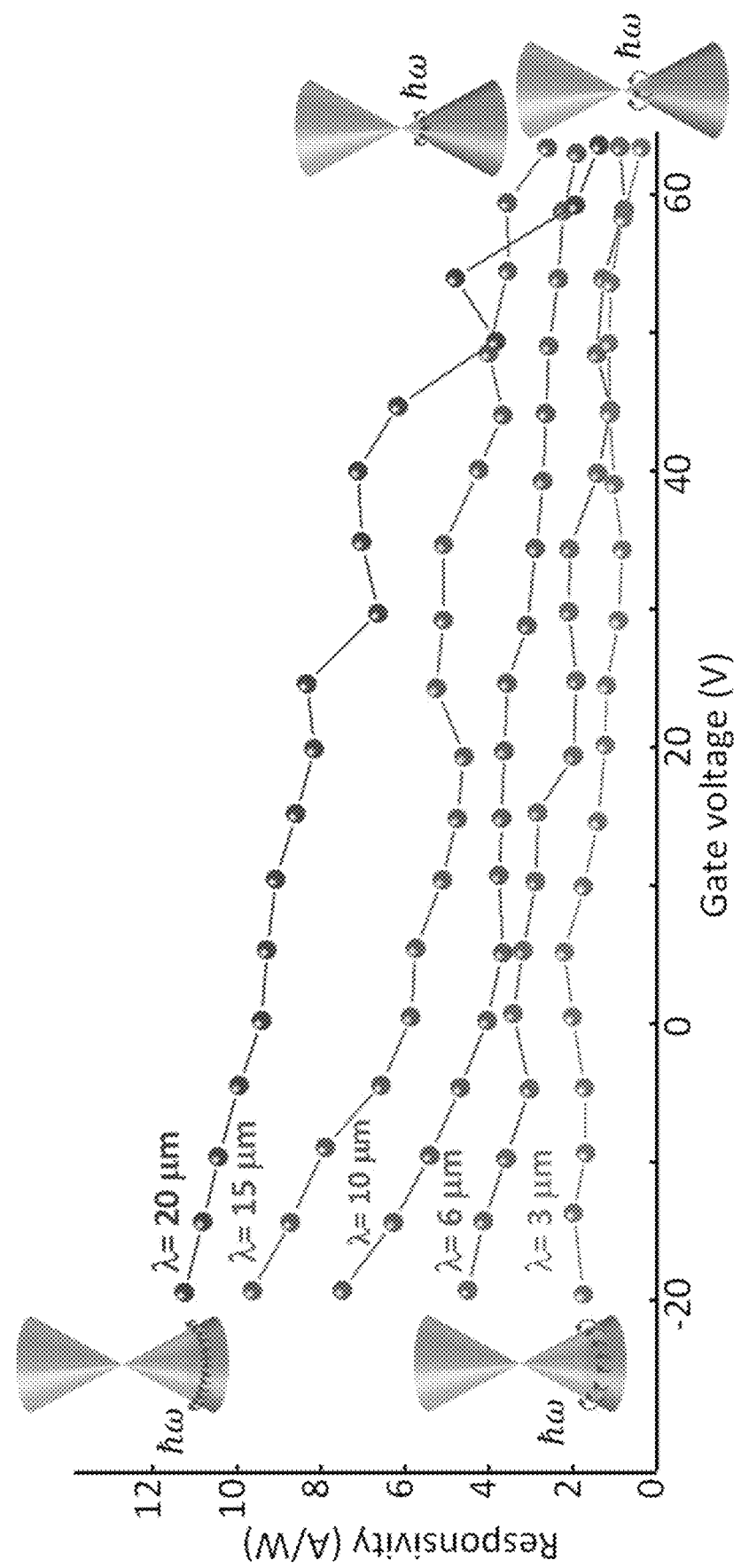
FIG. 8A shows a graph illustrating the responsivity of a fabricated metallo-graphene nanocomposite photodetector at wavelengths ranging from 3 μm to 20 μm in accordance with an embodiment of the invention.
Figure 8B:
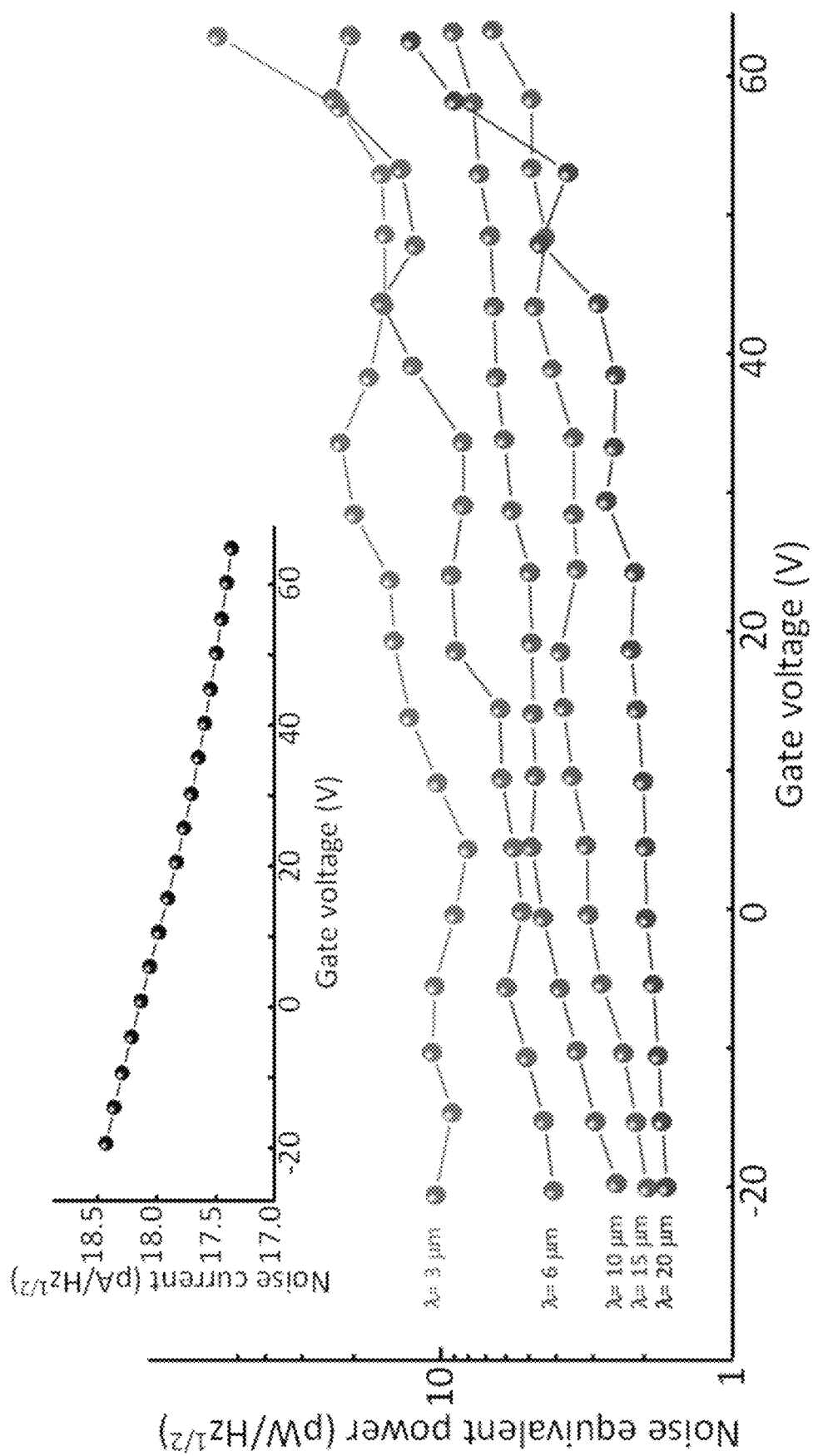
FIG. 8B shows a graph illustrating the noise equivalent power of a fabricated metallo-graphene nanocomposite photodetector at wavelengths ranging from 3 μm to 20 μm in accordance with an embodiment of the invention.

FIGS. 8A and 8B show the impact of the gate voltage on the performance of a metallo-graphene nanocomposite photodetector in the infrared regime, in which the optical absorption is dominated by intraband transitions in the graphene. FIG. 8A shows a graph illustrating the responsivity of a fabricated metallo-graphene nanocomposite photodetector at wavelengths ranging from 3 µm to 20 µm in accordance with an embodiment of the invention. The measured responsivity values have errors as large as ±20% due to thermal fluctuations in the measurement environment that led to a ±20% variation in the output power of the Globar infrared source. The impact of the gate voltage is described by the graphene band diagrams at various gate voltages and wavelengths (FIG. 8A inset). Inset figures in FIG. 8A illustrate the intraband transitions at 3 µm and 20 µm wavelengths under gate voltages of −20 V and 65 V. They illustrate that the gate voltage tunes the Fermi energy level, which can change the number of available states because of the cone-shaped band diagram of graphene. Because a larger number of states is available at higher Fermi energies, the photodetector responsivity values are increased by a decrease in the gate voltage at all wavelengths. At a given Fermi energy level, a larger number of states is available to be filled by lower-energy photons, which can result in an increase in photodetector responsivity values at longer wavelengths. Responsivity values as high as 11.5 A/W are achieved at a 20 µm wavelength and −20 V gate voltage, which corresponds to the lowest photon energy and highest Fermi energy level in the measurements, respectively. Notably, the operation bandwidth of the presented photodetector is not limited to 20 µm, and higher responsivity values are expected at longer wavelengths.

One of the drawbacks of the presented photodetector based on gold-patched graphene nanoribbons is its relatively large dark current due to the photoconductive nature of the photodetector. Therefore, the noise equivalent power ("NEP") of the fabricated photodetector can be calculated to assess the noise performance. The photodetector noise current, which is dominated by the Johnson Nyquist and shot-noise sources, can be extracted from the measured photocurrent and resistance data. FIG. 8B shows a graph illustrating the noise equivalent power of a fabricated metallo-graphene nanocomposite photodetector at wavelengths ranging from 3 μm to 20 μm in accordance with an embodiment of the invention. The inset shows the estimated noise current as a function of the gate voltage. All the measurements are performed at a bias voltage of $V_{bias}$=20 mV. The calculated NEP levels from the extracted noise current and measured responsivity values are in the range from 1 to 10 pW/Hz$^{1/2}$, exhibiting superior noise performance compared to commercially available room-temperature infrared detectors.

Figure 9A:
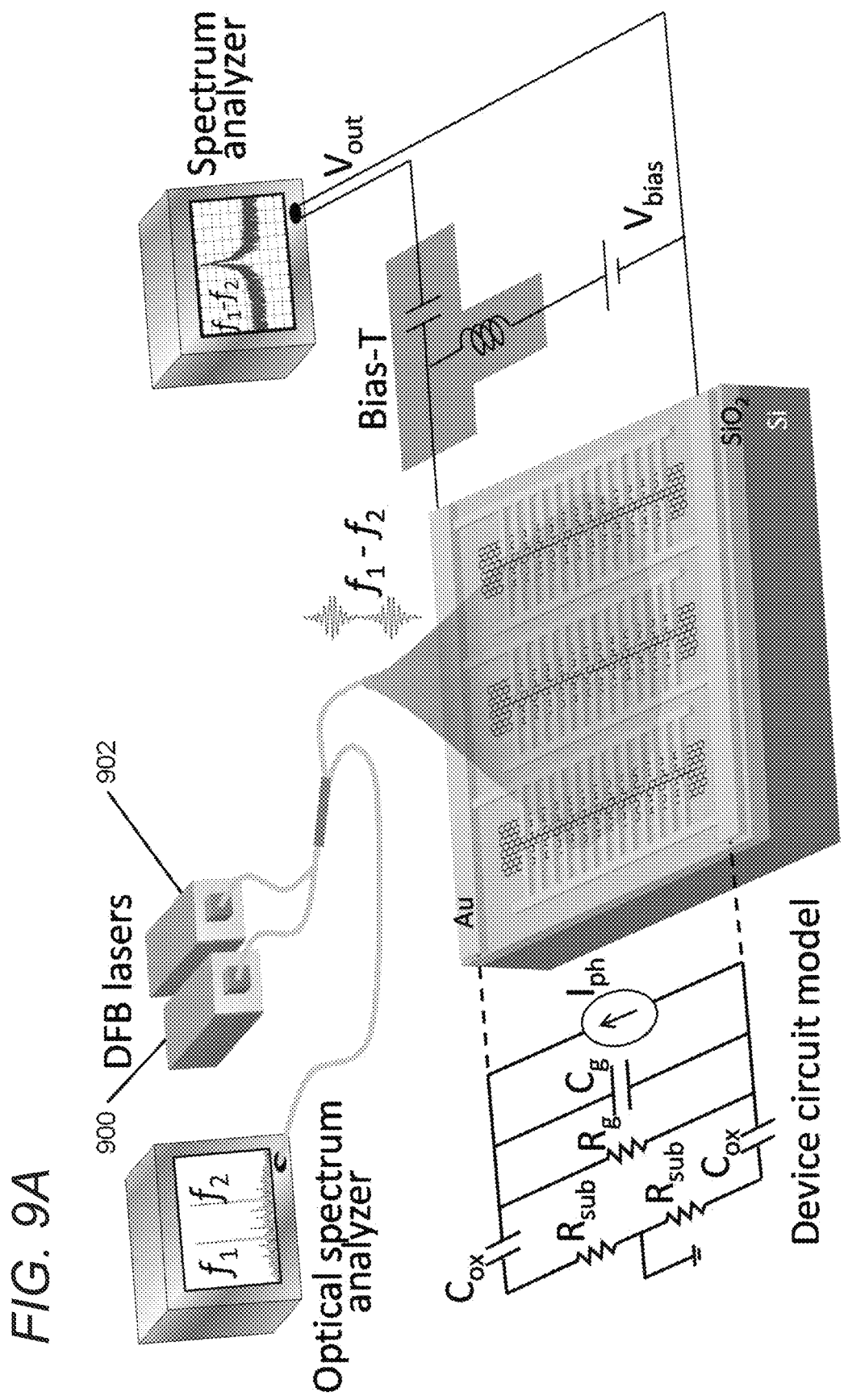
FIG. 9A conceptually illustrates a setup for characterizing the operation speed of a metallo-graphene nanocomposite photodetector implemented in accordance with an embodiment of the invention.
Figure 9B:
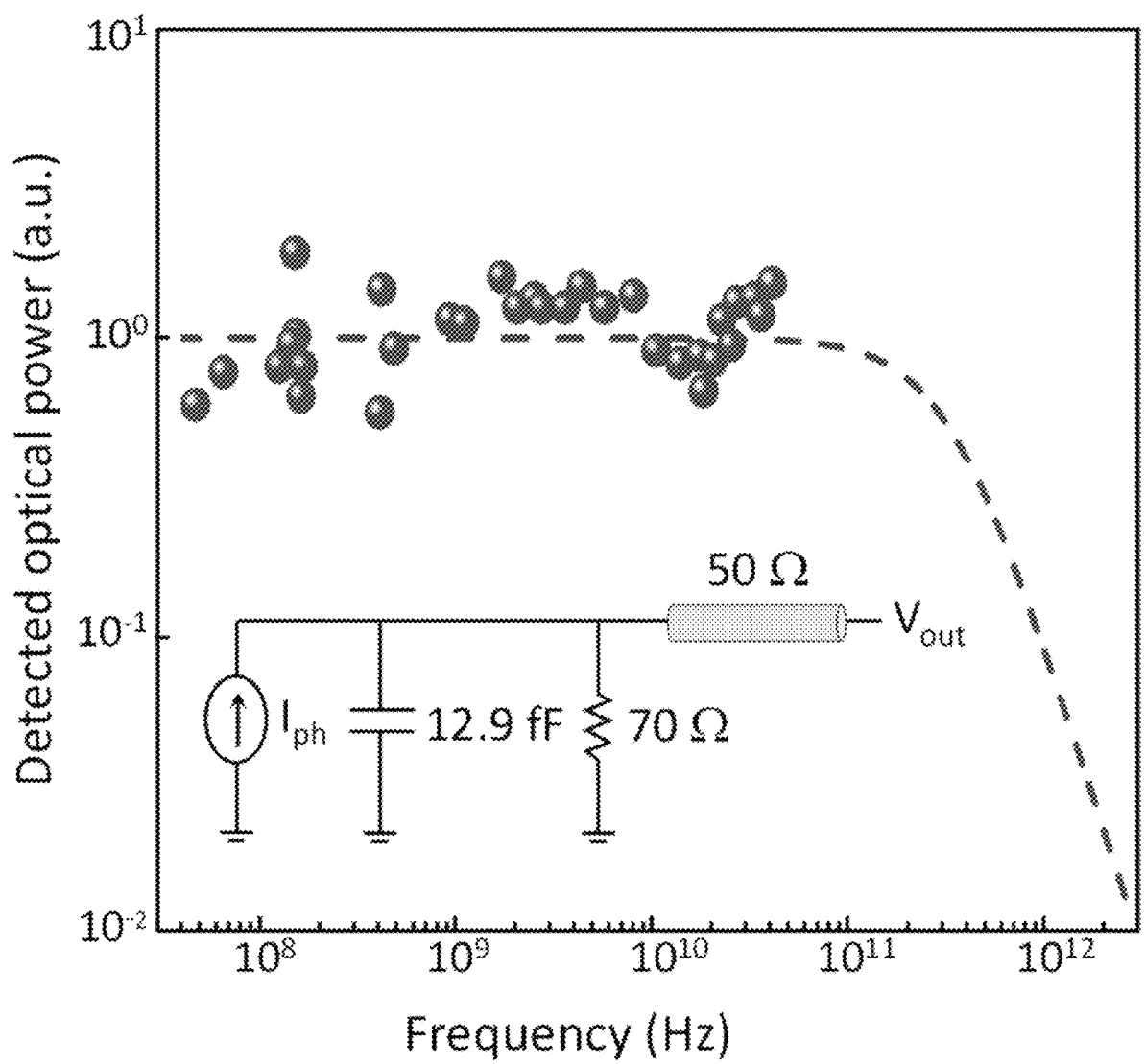
FIG. 9B shows a graph characterizing the operation speed of a metallo-graphene nanocomposite photodetector implemented in accordance with an embodiment of the invention.

A unique attribute of metallo-graphene nanocomposite photodetectors in accordance with a number of embodiments of the invention is that their superior bandwidth/responsivity performance is accompanied by an ultrafast photodetection speed. This ultrafast speed is possible through a special design of the utilized gold-patched graphene nanoribbons, which can offer broadband optical absorption in the graphene and sub-picosecond photocarrier transport times to the gold patches while maintaining low capacitive/resistive parasitics. A high-frequency electrical model characterizing the operation speed of a graphene photodetector in accordance with an embodiment of the invention is shown in FIGS. 9A and 9B. As shown, the beams from two wavelength-tunable DFB lasers 900, 902 at frequencies of f1 and f2 are focused onto the gold-patched graphene nanoribbons to generate a photocurrent, $I_{ph}$, at the optical beating frequency, f1-f2. The measured photoresponse values exhibit no roll-off up to 50 GHz, which is the frequency limitation of the utilized experimental setup. The dashed lines show the estimated frequency response of the metallo-graphene nanocomposite photodetector from the device electrical model. In the exemplary photodetector, the graphene resistance, $R_g$, and SiO$_2$ capacitance, $C_{ox}$, are measured to be 70Ω and 5.2 pF, respectively. Additionally, the gold patch capacitance, $C_g$, and substrate resistance, $R_{sub}$, are estimated as 12.9 fF and 5 MΩ, respectively. The photodetector frequency response predicted by this electrical model is dominated by the parasitic resistance of the graphene nanoribbons and capacitive parasitic of the gold patches, leading to a predicted photoresponse cutoff frequency of 425 GHz.

Although specific methods of fabricating metallo-graphene nanocomposites are discussed above, a person having ordinary skill in the art would appreciate that any of a number of microfabrication techniques can be used to fabricate photodetectors, energy conversion devices, and other structures incorporating gold-patched graphene nanoribbons and/or other metallo-graphene nanocomposites in accordance with embodiments of the invention.

What is claimed is:

1. A nanocomposite for converting electromagnetic radiation to an electric signal, the nanocomposite comprising:
   a photo-absorbing layer of graphene; and
   a plurality of electrically-connected metallic nanostructures in contact with the photo-absorbing layer, wherein the plurality of metallic nanostructures act as contact electrodes for the nanocomposite, wherein the plurality of metallic nanostructures have a metal-to-metal spacing at the sub-micrometer level and wherein the metallic nanostructures provide a strong concentration of photo-generated carriers near the contact electrodes,
   wherein the nanocomposite is characterizable in that the nanocomposite is capable of operating with responsivity levels of at least 0.6 A/W for all wavelengths ranging from 800 nanometers to 20 micrometers.

2. The nanocomposite of claim 1, wherein the photo-absorbing layer is a multi-layered graphene layer.

3. The nanocomposite of claim 1, wherein the photo-absorbing layer comprises graphene nanoribbons.

4. The nanocomposite of claim 1, wherein the photo-absorbing layer is doped in order to alter the Fermi energy level of the photo-absorbing layer.

5. The nanocomposite of claim 4, wherein the photo-absorbing layer is doped in order to increase optical absorption of infrared wavelengths of the photo-absorbing layer.

6. The nanocomposite of claim 4, wherein:
   the doping level of the photo-absorbing layer between the metallic nanostructures is different than at junctions of the metallic nanostructures.

7. The nanocomposite of claim 5, wherein the photo-absorbing layer is initially doped.

8. The nanocomposite of claim 5, wherein:
   the photo-absorbing layer is in contact with a dielectric; and
   the photo-absorbing layer is doped using a gate voltage.

9. The nanocomposite of claim 1, further comprising a semiconductor, wherein the photo-absorbing layer is in contact with the semiconductor, wherein the nanocomposite is configured to operate as a photodetector capable of detecting a wavelength range from ultraviolet wavelengths to microwave wavelengths.

10. The nanocomposite of claim 9, wherein the semiconductor comprises a silicon wafer having a silicon oxide layer.

11. The nanocomposite of claim 1, wherein the nanocomposite is capable of operating without a bias voltage.

12. The nanocomposite of claim 1, further comprising a dielectric with a backside semiconductor or conductor for gating the photo-absorbing layer and adjusting the Fermi energy level of the photo-absorbing layer.

13. The nanocomposite of claim 1, wherein the plurality of metallic nanostructures are placed in an asymmetric pattern.

14. The nanocomposite of claim 1, wherein the plurality of metallic nanostructures comprise a grating pattern.

15. The nanocomposite of claim 1, wherein the nanocomposite is capable of converting thermal energy into an electric signal.

16. The nanocomposite of claim 15, wherein the photo-absorbing layer is configured to generate carriers in response to receiving thermal energy.

17. The nanocomposite of claim 1, wherein the nanocomposite is characterizable in that the nanocomposite is capable of operating at over 50 GHz.

18. The nanocomposite of claim 1, wherein the nanocomposite is characterizable in that the nanocomposite is capable of operating with a responsivity of at least 0.1 A/W.

19. A nanocomposite for converting electromagnetic radiation to an electric signal, the nanocomposite comprising:
   a photo-absorbing layer of graphene; and
   a plurality of electrically-connected metallic nanostructures in contact with the photo-absorbing layer, wherein the plurality of metallic nanostructures act as contact electrodes for the nanocomposite, wherein the plurality of metallic nanostructures haw a metal-to-metal spacing at the sub-micrometer level and wherein the metallic nanostructures provide a strong concentration of photo-generated carriers near the contact electrodes,
   wherein the nanocomposite is characterizable in that the nanocomposite is capable of operating with a responsivity of at least 0.6 A/W at all frequencies ranging from 1 kHz to 50 GHz.

20. The nanocomposite of claim 1, wherein the photo-absorbing layer of material further comprises transition metal dichalcogenides.

* * * * *